(12) United States Patent
Wang et al.

(10) Patent No.: US 12,052,020 B2
(45) Date of Patent: Jul. 30, 2024

(54) METHODS AND SYSTEMS FOR CONTROLLING FREQUENCY AND PHASE VARIATIONS FOR PLL REFERENCE CLOCKS

(71) Applicant: PARADE TECHNOLOGIES, LTD., San Jose, CA (US)

(72) Inventors: Hongquan Wang, Shanghai (CN); Liang Chang, Shanghai (CN); Liang Xu, Shanghai (CN); Kochung Lee, San Jose, CA (US)

(73) Assignee: PARADE TECHNOLOGIES, LTD., San Jose, CA (US)

( * ) Notice: Subject to any disclaimer, the term of this patent is extended or adjusted under 35 U.S.C. 154(b) by 71 days.

(21) Appl. No.: 17/983,212

(22) Filed: Nov. 8, 2022

(65) Prior Publication Data

US 2023/0353158 A1 Nov. 2, 2023

Related U.S. Application Data

(63) Continuation of application No. PCT/CN2022/123619, filed on Sep. 30, 2022, and a
(Continued)

(51) Int. Cl.
*H03L 7/089* (2006.01)
*G06F 1/08* (2006.01)
(Continued)

(52) U.S. Cl.
CPC .............. *H03L 7/089* (2013.01); *G06F 1/08* (2013.01); *G06F 1/10* (2013.01); *G06F 13/4291* (2013.01);
(Continued)

(58) Field of Classification Search
CPC ......... H03L 7/089; H03L 7/083; H03L 7/107; H03L 7/0807; H03L 7/095; H03L 7/199;
(Continued)

(56) References Cited

U.S. PATENT DOCUMENTS 3,810,039 A * 5/1974 Fein .................... A61B 5/18
327/131
5,525,935 A 6/1996 Joo et al.
(Continued)

OTHER PUBLICATIONS

Chen, Office Action, U.S. Appl. No. 17/732,307, Jun. 14, 2023, 10 pgs.
(Continued)

*Primary Examiner* — Faisal M Zaman
(74) *Attorney, Agent, or Firm* — Morgan, Lewis & Bockius LLP

(57) ABSTRACT

This application is directed to frequency controlling in an electronic device that includes a selector, a clock generated, and a controller. The selector selects one of a first reference signal and a second reference signal as an input signal having an input phase. The clock generator receives the input signal and generates a periodic signal, and the periodic signal has an output phase that matches the input phase of the input signal. While the first reference signal is selected as the input signal, the controller identifies a temporal range including a peak instant at which the second reference signal reaches a peak frequency, select a switching instant within the temporal range based on a known temporal position of the peak instant with respect to the temporal range, and control the selector to select the second reference signal as the input signal at the switching instant.

20 Claims, 19 Drawing Sheets

Related U.S. Application Data continuation-in-part of application No. 17/732,307, filed on Apr. 28, 2022.

(51) Int. Cl.
*G06F 1/10* (2006.01)
*G06F 13/42* (2006.01)
*H03L 7/083* (2006.01)
*H03L 7/107* (2006.01)

(52) U.S. Cl.
CPC .............. *H03L 7/083* (2013.01); *H03L 7/107* (2013.01); *G06F 2213/0026* (2013.01)

(58) Field of Classification Search
CPC .......... G06F 1/08; G06F 1/10; G06F 13/4291; G06F 2213/0026
See application file for complete search history.

(56) References Cited

U.S. PATENT DOCUMENTS

| | | | | |
|---|---|---|---|---|
| 5,963,068 | A * | 10/1999 | Hardesty | G06F 1/08 327/299 |
| 6,718,476 | B1 | 4/2004 | Shima | |
| 6,948,017 | B2 * | 9/2005 | Carpenter | G06F 1/24 710/107 |
| 6,980,589 | B1 | 12/2005 | Babb | |
| 7,187,742 | B1 * | 3/2007 | Logue | G06F 1/10 375/376 |
| 8,860,482 | B1 | 10/2014 | Liu et al. | |
| 9,490,824 | B1 | 11/2016 | Singh et al. | |
| 2003/0221044 | A1 | 11/2003 | Nishio | |
| 2005/0053179 | A1 * | 3/2005 | Knapp | H04L 7/0004 375/354 |
| 2007/0257710 | A1 * | 11/2007 | Mari | G06F 1/08 327/99 |
| 2008/0056426 | A1 | 3/2008 | Si et al. | |
| 2008/0215907 | A1 * | 9/2008 | Wilson | H03L 7/1974 713/500 |
| 2009/0086874 | A1 | 4/2009 | Wang et al. | |
| 2012/0157031 | A1 | 6/2012 | Strickland | |
| 2013/0090762 | A1 | 4/2013 | Asai et al. | |
| 2014/0115408 | A1 * | 4/2014 | Andrejic | G06F 1/324 714/E11.024 |
| 2016/0087637 | A1 | 3/2016 | Donnenwirth | |
| 2016/0294280 | A1 * | 10/2016 | Akaho | H03B 5/24 |
| 2018/0225251 | A1 * | 8/2018 | Sthoeger | G06F 13/4291 |
| 2020/0336151 | A1 | 10/2020 | Olumuyiwa | |
| 2021/0083666 | A1 * | 3/2021 | Matalon | H03K 5/135 |
| 2021/0159789 | A1 | 5/2021 | Hsu | |
| 2022/0019257 | A1 | 1/2022 | Chambers et al. | |
| 2022/0019258 | A1 * | 1/2022 | Remple | G06F 1/3296 |
| 2023/0350451 | A1 * | 11/2023 | Chen | H03L 7/0807 |
| 2023/0353158 | A1 | 11/2023 | Wang et al. | |

OTHER PUBLICATIONS

Chen, Final Office Action, U.S. Appl. No. 17/732,307, Nov. 30, 2023, 11 pgs.

Chen, Notice of Allowance, U.S. Appl. No. 17/732,307, Mar. 14, 2024, 9 pgs.

* cited by examiner

CDR side Circuit

METHODS AND SYSTEMS FOR CONTROLLING FREQUENCY AND PHASE VARIATIONS FOR PLL REFERENCE CLOCKS

RELATED APPLICATION

This application is a continuation in part of and claims priority to U.S. patent application Ser. No. 17/732,307, titled "Methods and Systems for Controlling Frequency Variation for a PLL Reference Clock," filed on Apr. 28, 2022, which is hereby incorporated by reference in its entirety.

This application claims priority to International Patent Application No. PCT/CN2022/123619, titled "Methods and Systems for Controlling Frequency and Phase Variations for PLL Reference Clocks," filed on Sep. 30, 2022, which is hereby incorporated by reference in its entirety.

TECHNICAL FIELD

This application relates generally to data communication, including but not limited to, methods and systems for transferring data between two electronic devices or components using a high-speed serial expansion bus, such as a Peripheral Component Interconnect Express (PCI Express) bus.

BACKGROUND

Many electronic devices are physically coupled to each other and communicate with each other using data links and interfaces that comply with high-speed serial computer expansion bus standards (e.g., PCI Express). These bus standards allow application of retimers and redrivers to extend a channel reach at a high data speed. A redriver is an analog reach extension device designed to boost portions of a signal to counteract attenuation caused by signal propagation over a physical interconnect of a corresponding data link. A retimer is a mixed-signal device that is standard-aware and has an ability to fully recover the data, extract the embedded clock, and retransmit a fresh copy of the data using a clean clock. Compared with the redriver, the retimer actively participates in applying the bus standard to implement negotiation, timeouts, bit manipulation, jitter resetting, signal equalization, skew correction, and many other functions. The retimer functions under the control of a local crystal clock or an external reference clock, and often demonstrates unstable performance (e.g., an excessive signal overshoot) when the local crystal and external reference clocks switch between each other, thereby compromising data transferred by the corresponding data links. It would be beneficial to have a more effective frequency management mechanism in data links and interfaces using the high-speed serial computer expansion bus standards than the current practice.

SUMMARY

This application is directed to electronic devices, data links, and data interfaces that switch between two distinct clock frequencies in a controlled manner. Examples of these electronic devices, data links, and data interfaces include, but are not limited to, USB4 cables and DP 2.0 cables. These electronic devices, data links, and data interfaces comply with high-speed serial computer expansion bus standards (e.g., PCI Express). Such bus standards have substantially low tolerances (e.g., less than 400 ppm) for a frequency variation of a transmission phase-locked loop (PLL) in a retimer, particularly while a reference signal of the PLL switches from a local crystal clock to a recovery clock. Optionally, the local crystal clock is substantially stable, and the recovery clock is modulated with spread-spectrum clocking (SSC)). The retimer is modified to incorporate a controller configured to identify a temporal range TR in which a reference signal reaches a peak frequency, and enable the recovery clock to initiate driving the retimer within the temporal range TR (e.g., within a frequency rising portion of the temporal range TR). By these means, retimers of the electronic devices, data links, and data interfaces switch from the local crystal clock to the recovery clock smoothly, causing no or little signal overshooting that could compromise the quality of data transmission in violation of the high-speed serial computer expansion bus standards.

In one aspect, an electronic device includes a selector, a clock generator, and a controller. The selector is configured to select one of a first reference signal and a second reference signal as an input signal having an input phase. The clock generator is coupled to the selector and configured to receive the input signal and generate a periodic signal with reference to the input signal. The periodic signal has an output phase that matches the input phase of the input signal. The controller is coupled to the selector and configured to, while the first reference signal is selected as the input signal, determine whether the second reference signal is in a temporal range TR in which the second reference signal reaches a peak frequency. The controller is also configured to in accordance with a determination that the second reference signal is in the temporal range, control the selector to select the second reference signal as the input signal. In some implementations, the electronic device includes a data link having a retimer including a transmitter portion, a receiver portion, the selector, the clock generator, and the controller. The retimer is configured to operate in a link training mode and a data transmission mode, reconfigure the receiver or transmitter portion based on the periodic signal that is generated from the first reference signal in the link training mode, and communicate data in synchronization with the periodic signal that is generated from the second reference signal in the data transmission mode.

In some implementations, while the first reference signal is selected as the input signal, the electronic device determines that a frequency of the second reference signal is rising towards the peak frequency during the temporal range TR. The selector is controlled by the controller to select the second reference signal in place of the first reference signal in accordance with a determination that the frequency of the second reference signal is rising towards the peak frequency in the temporal range.

In some implementations, the first reference signal has a first frequency that is substantially stable, and the peak frequency is equal to the first frequency. Further, in some implementations, the second reference signal has a second frequency that varies periodically between the peak frequency and a down-spreading frequency. Additionally, in some implementations, the second frequency of the second reference signal varies with a spreading frequency corresponding to a spreading period. The controller is configured to monitor an overshoot of an output frequency of the periodic signal and dynamically adjust the temporal range based on the overshoot of the output frequency of the periodic signal. In an example, the output frequency of the periodic signal is substantially equal to 20 GHz. The first frequency of the first reference signal is substantially equal to 25 MHz. The spreading frequency is substantially equal to 30 kHz. The second frequency of the second reference signal varies, periodically with the spreading frequency, between 25 MHz and 24.875 MHz. The temporal range is less than 0.5% of the spreading period.

In another aspect, a clock generation method is implemented at an electronic device. The method includes selecting an input signal from a first reference signal and a second reference signal and generating a periodic signal with reference to the input signal. The periodic signal has an output phase that matches an input phase of the input signal. The method further includes while selecting the first reference signal as the input signal, determining whether the second reference signal is in a temporal range TR in which the second reference signal reaches a peak frequency. The method further includes in accordance with a determination that the second reference signal is in the temporal range TR, switching the input signal from the first reference signal to the second reference signal.

In yet another aspect, a method is implemented to provide an electronic device. The method includes providing a selector configured to select an input signal from a first reference signal and a second reference signal and providing a clock generator configured to generate a periodic signal with reference to the input signal. The periodic signal has an output phase that matches an input phase of the input signal. The method includes providing a controller coupled to the clock generator. The controller is configured to, while the first reference signal is selected as the input signal, determine whether the second reference signal is in a temporal range in which the second reference signal reaches a peak frequency, and in accordance with a determination that the second reference signal is in the temporal range, switch the input signal from the first reference signal to the second reference signal.

In an aspect, an electronic device includes a selector, a clock generator, and a controller. The selector is configured to select one of a first reference signal and a second reference signal as an input signal having an input phase. The clock generator is coupled to the selector, and configured to receive the input signal and generate a periodic signal with reference to the input signal. The periodic signal has an output phase that matches the input phase of the input signal. The controller is coupled to the selector, and configured to, while the first reference signal is selected as the input signal, identify a temporal range including a peak instant at which the second reference signal reaches a peak frequency. The peak instant has a known temporal position with respect to the temporal range. The controller is further configured to while the first reference signal is selected as the input signal, select a switching instant within the temporal range based on the known temporal position and control the selector to select the second reference signal as the input signal at the switching instant.

In some implementations, the controller further includes a phase frequency detector and a pulse modulator. The phase frequency detector is configured to receive the first and second reference signals and generate a difference indicator signal indicating a phase difference between phases of the first and second reference signals. The pulse modulator is coupled to the phase frequency detector, and configured to modulate the difference indicator signal and generate a first range indicator signal enabled during a plurality of pulse zero durations. The temporal range is identified in the plurality of pulse zero durations based on a width of each pulse zero duration.

In some implementations, the controller further includes a comparator and a signal conditioning circuit. The comparator is configured to generate a difference signal having a temporal voltage level that indicates a frequency mismatch between the first and second reference signals. The signal conditioning circuit is configured to receive the difference signal and generate a second range indicator signal enabled during the temporal range, thereby indicating that a temporal width of the temporal range is linearly related to a duty cycle of the second range indicator signal.

In another aspect, a clock generation method includes selecting an input signal from a first reference signal and a second reference signal and generating a periodic signal with reference to the input signal. The periodic signal has an output phase that matches an input phase of the input signal. The method further includes while the first reference signal is selected as the input signal, identifying a temporal range including a peak instant at which the second reference signal reaches a peak frequency. The peak instant has a known temporal position with respect to the temporal range. The method further includes while the first reference signal is selected as the input signal, selecting a switching instant within the temporal range based on the known temporal position and selecting the second reference signal as the input signal used to generate the periodic signal at the switching instant.

In yet another aspect, a method includes providing a clock generator configured to select an input signal from a first reference signal and a second reference signal and generate a periodic signal with reference to the input signal. The periodic signal having an output phase that matches an input phase of the input signal. The method further includes providing a controller coupled to the clock generator. The controller is configured to, while the first reference signal is selected as the input signal, identify a temporal range including a peak instant at which the second reference signal reaches a peak frequency. The peak instant has a known temporal position with respect to the temporal range. The controller is further configured to, while the first reference signal is selected as the input signal, select a switching instant within the temporal range based on the known temporal position and select the second reference signal as the input signal to the clock generator at the switching instant.

These illustrative implementations and implementations are mentioned not to limit or define the disclosure, but to provide examples to aid understanding thereof. Additional implementations are discussed in the Detailed Description, and further description is provided there.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

Like reference numerals refer to corresponding parts throughout the several views of the drawings.

DESCRIPTION OF IMPLEMENTATIONS

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

An electronic device or component can be communicatively coupled to one or more other electronic devices or components by bidirectional data links that comply with a high-speed serial expansion bus standard, such as PCI Express. A retimer in such a data link uses a substantially stable local crystal clock for link training and switches to a recovery clock having a down spread spectrum for data transmission. The local crystal clock and the recovery clock have different frequencies and different phases. In various implementations of this application, after link training, an input signal of a clock signal generator of the retimer switches from the local crystal clock to the recovery clock within a temporal range TR in which the recovery clock reaches a peak frequency $f_P$. Starting from a switching time $T_S$, a PLL of the retimer operates to generate a signal with reference to the recovery clock. In the temporal range TR, a frequency difference between the local crystal and recovery clocks is substantially small (e.g., <0.5%). Stated another way, the frequency and phase differences of the crystal clock and recovery clocks are substantially close in the temporal range TR, such that switching between the crystal clock and recovery clocks does not impact the retimer significantly. In some situations, the crystal clock is switched to the recovery clock as the recovery clock is heading to the peak frequency $f_P$ at a rising portion of the temporal range TR. After frequency switching, the PLL of the retimer tunes a loop bandwidth for an acquisition period. Upon phase locking, the PLL optionally uses different loop parameters to track SSC of the recovery clock.

Figure 1:
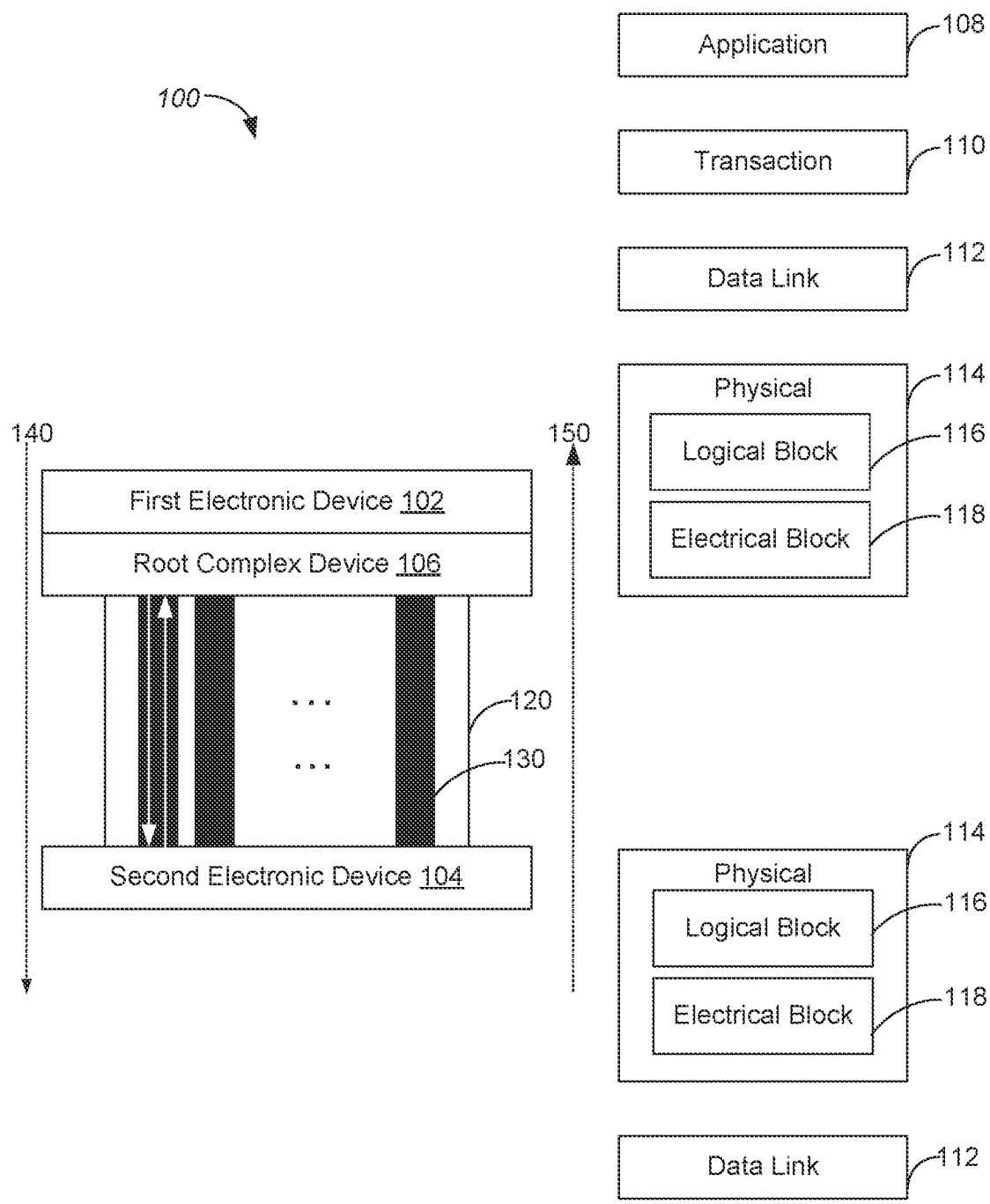
FIG. 1 is an example PCI Express electronic system in which a first electronic device or component is electrically coupled to a second electronic device or component via a data link, in accordance with some implementations.

FIG. 1 is an example PCI Express electronic system 100 in which a first electronic device or component 102 is electrically coupled to a second electronic device or component 104 via a data link 120, in accordance with some implementations. In an example, the first electronic device 102 includes a central processing unit (CPU) of a personal computer, and the second electronic device 104 is a peripheral component of the personal computer, such as a graphics card, a hard drive, a solid state drive, a Wi-Fi communication module, or an Ethernet card. The data link 120 includes a connection port for receiving from the second electronic device 104. The connection port is optionally formed on a mother board of the personal computer. The data link 120 complies with PCI Express (i.e., PCIe), which is a high-speed serial computer expansion bus standard, and provides an interface to communicate data packets between the first and second electronic devices 102 and 104 in compliance with the PCI Express. The data link 120 is a serial data bus including one or more data transmission lanes 130. Each lane 130 includes two wire sets for transmitting and receiving data packets, thereby supporting full-duplex communication between the first and second electronic devices 102 and 104. In some examples, the data link 120 has 1, 4, 8, or 16 lanes 130 coupled in a single data port of the data link 120. For each lane, the two wire sets correspond to a downstream data direction 140 or an upstream data direction 150 defined with respect to the first electronic device 102. Optionally, each wire set includes two wires for carrying a pair of differential signals.

In some implementations, the first electronic device 102 includes or is coupled to a root complex device 106 that is further coupled to the data link 120. The root complex device 106 is configured to generate requests for transactions including a series of one or more packet transmissions on behalf of the first electronic device 102. Examples of the transactions include, but are not limited to, Memory Read, Memory Read Lock, IO Read, IO Write, Configuration Read, Configuration Write, and Message. In some implementations, the first electronic device 102 is coupled to one or more additional electronic devices besides the second electronic device 104. The data link 120 includes one or more switch devices to couple the root complex device 106 of the first electronic device 102 to multiple endpoints including the second electronic device 104 and additional electronic devices not shown in FIG. 1.

PCI Express is established based on a layered model including an application layer 108, a transaction layer 110, a data link layer 112, and a physical layer 114. As the top layer, the application layer 108 is implemented in software programs, such as Ethernet, NVMe, SOP, AHCI, and SATA. In the transaction layer 110, each transaction of a series of packet transmissions is implemented as requests and responses separated by time. For example, a memory-related transaction is translated to device configuration and control data transferred to or from the second electronic device 104 (e.g., a memory device). Data packets associated with each transaction are managed by data flows on the data link layer 112. The physical layer 114 of PCI Express controls link training and electrical (analog) signaling, and includes a logical block 116 and an electrical block 118. The logic block 116 defines ordered data sets in training states (e.g., TS1 and TS2), and the electrical block 118 defines eye diagram characteristics and analog waveforms. Each layer of the layered model includes first specifications for a transmitting end where a root complex device 106 is coupled and second specifications for a receiving end where a peripheral component (i.e., the second electronic device 104) is coupled.

As high frequency signals are transmitted within the lanes 130 of the data link 120, these signals are distorted and spread over sequential symbols and result in inter symbol interferences (ISI) and bit errors at the receiving end of the second electronic device 104. These ISI and bit errors can be suppressed by a finite impulse response (FIR) driver that is coupled serially on a path of the data link 120 and configured with equalization settings using an equalization procedure. The equalization procedure is implemented when a high speed data transfer rate needs to be initialized, when an equalization request is issued from the application layer 108, or when a bit error rate (BER) exceeds a data error tolerance. A full data path is used in the equalization procedure to initialize and update the equalization settings of the FIR driver, and a bit level data path is used out of (i.e., before and after) the equalization procedure to transfer data based on the latest equalization settings that are previously initialized or updated. In some implementations, initiation and termination of the equalization procedure are detected on the physical layer 114 based on data packets transferred over the data link 120. Control signals are generated on the physical layer 114 (i.e., not provided via the higher application or transaction layer) to enable switching between the full data path and the bit level data path.

Figure 2A:
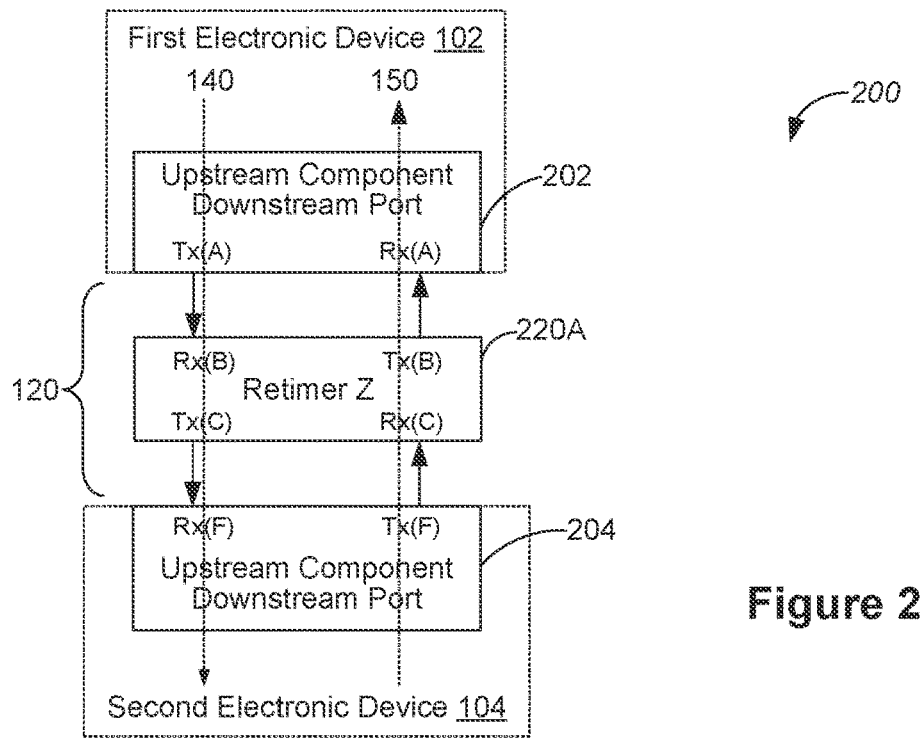
FIGS. 2A and 2B are two example electronic systems in each of which a data link is coupled between two electronic devices or components and includes at least one retimer, in accordance with some implementations.
Figure 2B:
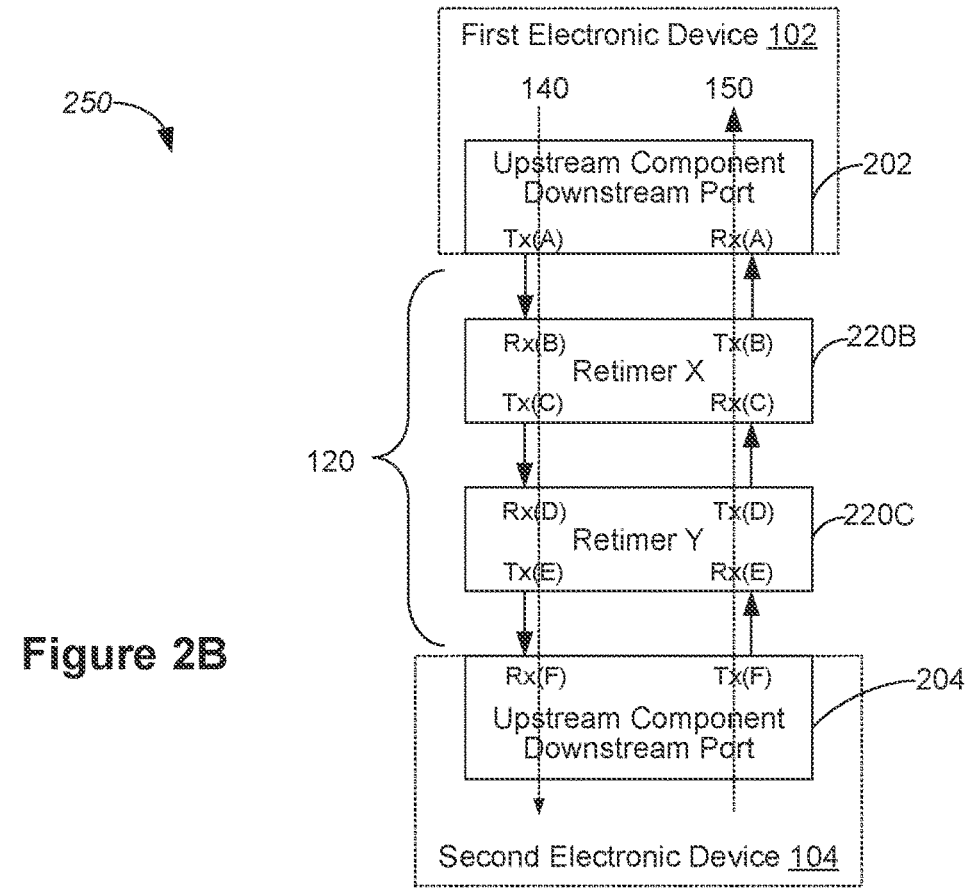
Figure 4:
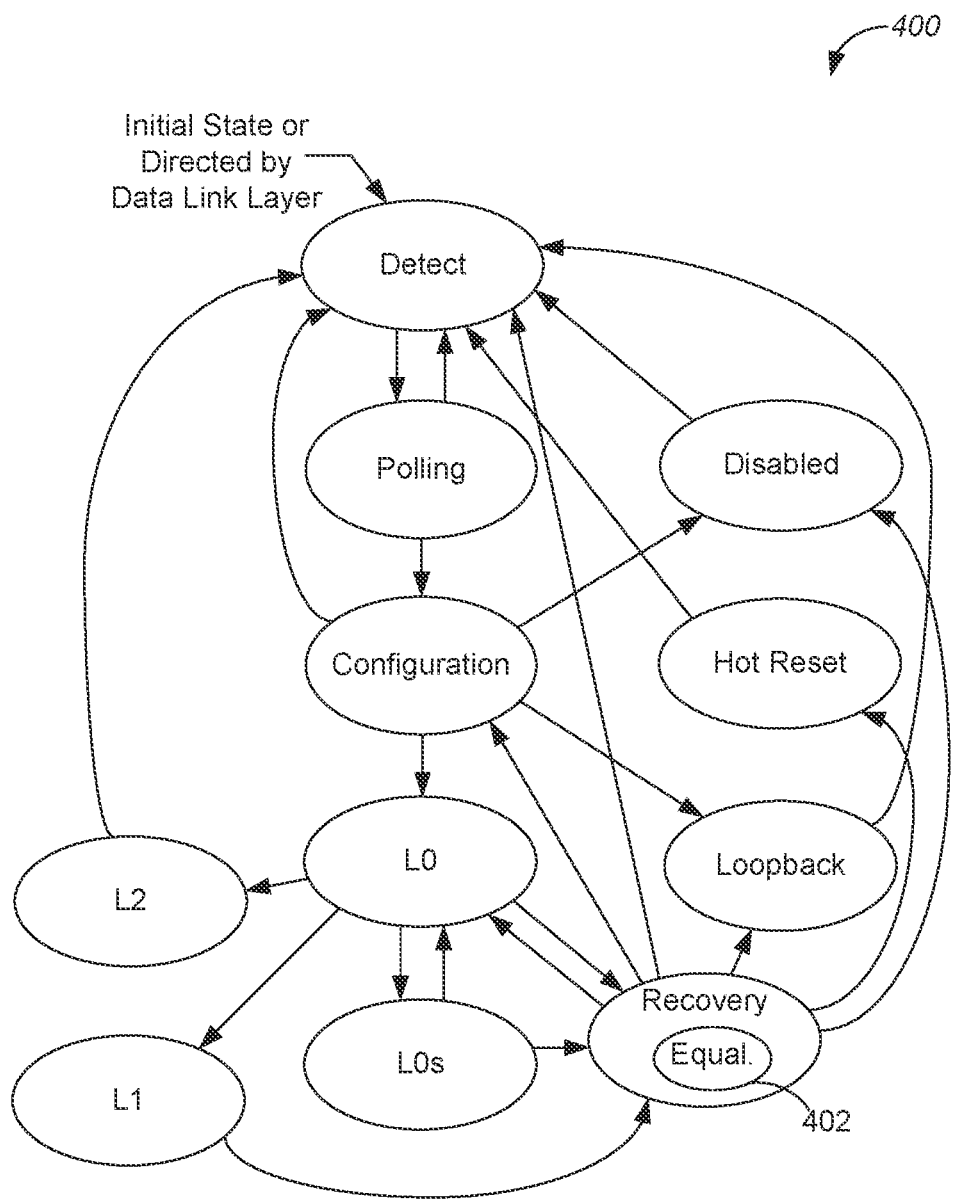
FIG. 4 is a state diagram of a Link Training and Status State Machine (LTSSM) of a data link, in accordance with some implementations.

FIGS. 2A and 2B are two example electronic systems 200 and 250 in which a data link 120 is coupled between two electronic devices or components 102 and 104 and includes at least one retimer 220, in accordance with some implementations. The retimer 220 is a mixed-signal device that is configured to transmit data packets actively (i.e., extract an embedded clock and recover the data packets in compliance with a bus standard, such as PCI Express). In an example, the retimer has a continuous time linear equalizer (CTLE), a wideband gain stage, and one or more of a clock and data recovery (CDR) circuit, a decision feedback equalizer (DFE), and a finite impulse response (FIR) driver. A state machine and/or a microcontroller is used in the retimer 220 to manage the CTLE, wideband gain stage, DFE, and FIR driver, and implement a link training and status state machine (LTSSM) as shown in FIG. 4.

The data link 120 enables bidirectional data communication between the electronic devices 102 and 104. A first electronic device 102 includes an upstream component 202 having a transmitting interface Tx(A) and a receiving interface Rx(A), and a second electronic device 104 includes a downstream component 204 having a receiving interface Rx(F) and a transmitting interface Tx(F). Each retimer 220 of the data link 120 is coupled between the electronic devices 102 and 104, and has a receiving interface Rx and a transmitting interface Tx for each of a downstream data direction 140 and an upstream data direction 150. Referring to FIG. 2A, the data link 120 includes only one retimer 220A. In some implementations, the retimer 220A is disposed proximity to the upstream component 202 of the first electronic device 102 or the downstream component 204 of the second electronic device 104. A receiving interface Rx(B) and a transmitting interface Tx(B) of the retimer 220A are coupled to the transmitting interface Tx(A) and receiving interface Rx(A) of the first electronic device 102, respectively. Another transmitting interface Tx(C) and another receiving interface Rx(C) of the retimer 220A are coupled to the receiving interface Rx(F) transmitting interface Tx(F) of the second electronic device 104, respectively. As such, data packets are transmitted between the electronic devices 102 and 104, either sequentially through the interfaces Tx(A), Rx(B), Tx(C), and Rx(F) on the downstream data direction 140 or sequentially through the interfaces Tx(F), Rx(C), Tx(B), and Rx(A) on the upstream data direction 150.

Referring to FIG. 2B, the data link 120 includes two retimers 220B and 220C that are electrically coupled in series between the first and second electronic devices 102 and 104. In an example, the retimer 220B is disposed proximity to the upstream component 202 of the first electronic device 102, and the retimer 220C is disposed proximity to the downstream component 204 of the second electronic device 104. A receiving interface Rx(B) and a transmitting interface Tx(B) of the retimer 220B are coupled to the transmitting interface Tx(A) and receiving interface Rx(A) of the first electronic device 102, respectively. Another transmitting interface Tx(C) and another receiving interface Rx(C) of the retimer 220B are coupled to a receiving interface Rx(D) and a transmitting interface Tx(D) of the retimer 220C, respectively. Another transmitting interface Tx(E) and another receiving interface Rx(E) of the retimer 220C are coupled to the receiving interface Rx(F) and transmitting interface Tx(F) of the second electronic device 104, respectively. As such, data packets are transmitted between the electronic devices 102 and 104, either sequentially through the interfaces Tx(A), Rx(B), Tx(C), Rx(D), Tx(E), and Rx(F) on the downstream data direction 140 or sequentially through the interfaces Tx(F), Rx(E), Tx(D), Rx(C), Tx(B), and Rx(A) on the upstream data direction 150.

Figure 3A:
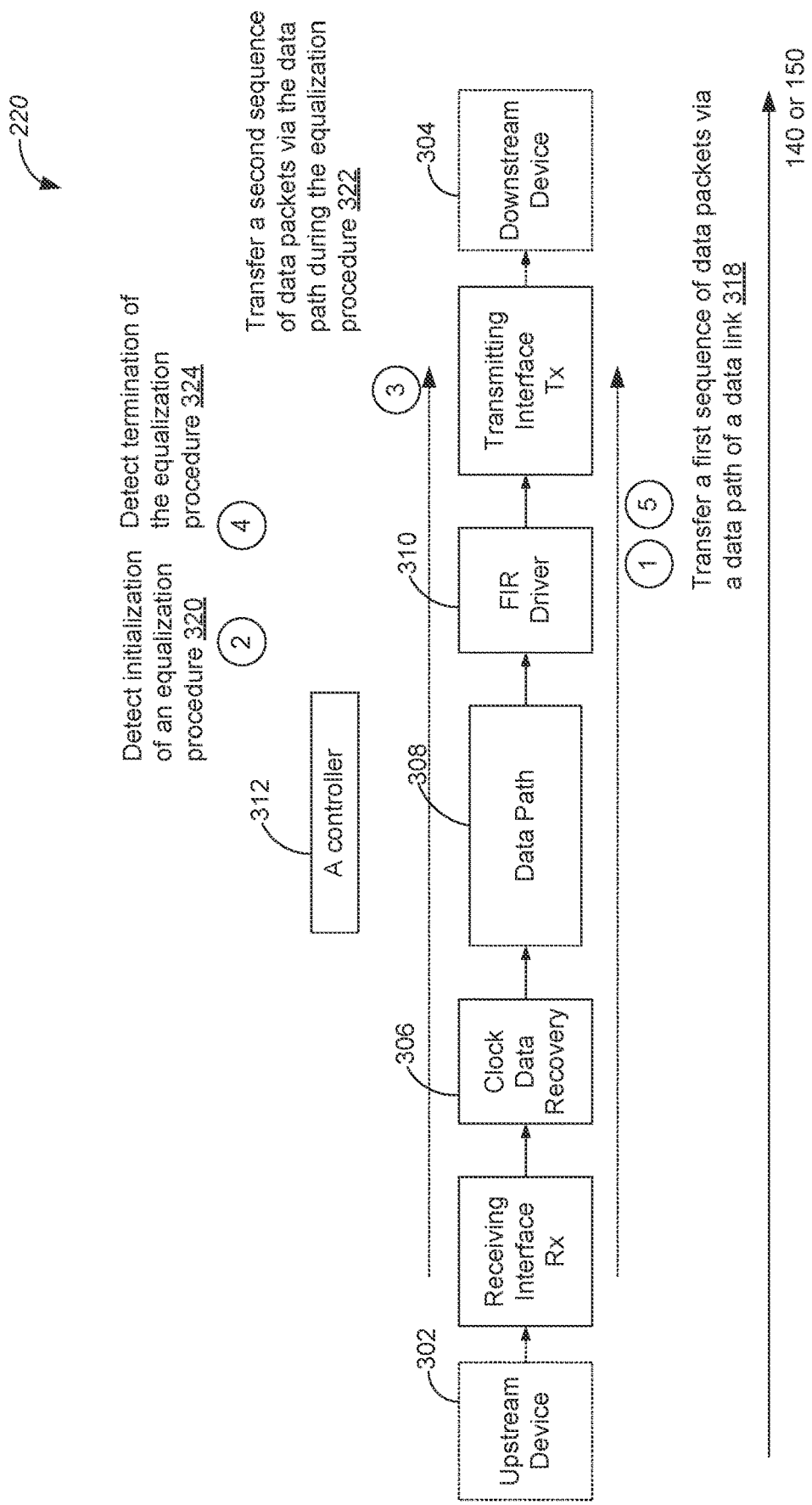
FIG. 3A is a simplified block diagram of an example retimer of a data link 120 that transfers data on a downstream or upstream data direction, in accordance with some implementations.

FIG. 3A is a simplified block diagram of an example retimer 220 of a data link 120 that transfers data on a downstream or upstream data direction 140 or 150, in accordance with some implementations. The retimer 220 includes a receiving interface Rx, clock and data recovery circuit 306, data path 308, FIR driver 310, and a transmitting interface Tx. The retimer 220 is configured to recover and amplify signals received at the receiving interface Rx corresponding to the downstream or upstream data direction 140 or 150, thereby extending a channel reach of the data link 120. Specifically, the receiving interface Rx receives data packets from an upstream device 302. The data packets optionally include link training data, transaction requests, or transaction responses. The clock and data recovery circuit 306 recovers an embedded clock signal (also called a recovery clock) and data from the data packets. The data path 308 processes the recovered data under the control of the embedded clock signal, and output the processed data to be fed into the FIR driver 310. An output of the FIR driver 310 is provided to the transmitting interface Tx and a downstream device 304.

Referring to FIG. 2A, on the downstream data direction 140, the upstream and downstream devices 302 and 304 of the retimer 220A are the first electronic device 102 and the second electronic device 104, respectively. On the upstream data direction 150, the upstream and downstream devices 302 and 304 of the retimer 220A are the second electronic device 104 and the first electronic device 102, respectively. Referring to FIG. 2B, on the downstream data direction 140, the upstream and downstream devices 302 and 304 of the retimer 220B are the first electronic device 102 and the retimer 220C, respectively, and the upstream and downstream devices 302 and 304 of the retimer 220C are the retimer 220B and the second electronic device 104, respectively. On the upstream data direction 150, the upstream and downstream devices 302 and 304 of the retimer 220C are the second electronic device 104 and the retimer 220B, respectively, and the upstream and downstream devices 302 and 304 of the retimer 220B are the retimer 220C and the first electronic device 102.

Referring to FIG. 3A, the FIR driver 310 is configured to improve signal quality of the data packets via digital signal conditioning (e.g., via high frequency filtering in a digital domain), and has a plurality of equalization settings (e.g., filtering coefficients). A default coefficient preset or a previously determined set of filtering coefficients is applied to transmit data packets upon initiation of a data transmission process, and updated with another preset or new set of filtering coefficients during link training. To update the coefficients of the FIR driver 310, protocol-aware equalization negotiation is implemented between the upstream device 302 and the downstream device 304. For example, referring to FIG. 2A, the retimer 220A is engaged in protocol-aware equalization negotiation between the upstream component 202 and the downstream component 204. Likewise, referring to FIG. 2B, the retimer 220B is engaged in protocol-aware equalization negotiation between the upstream component 202 and the retimer 220C, and the retimer 220C is engaged in protocol-aware equalization negotiation between the retimer 220B and the downstream component 204.

Stated another way, the retimer 220 is configured to execute an equalization procedure to use the negotiation between the upstream device 302 and the downstream device 304 to update the coefficients of the FIR driver 310. In some implementations, this equalization procedure complies with an electronic device bus standard, e.g., PCI Express 3.0 or above. A local crystal clock has a substantially stable frequency (e.g., having a variation within ±0.01%) is applied during the equalization procedure that determines the coefficients of the FIR driver 310. For example, the negotiation and equalization procedure continues till a predefined equalization criterion is satisfied (e.g., till a bit error rate received at the downstream device 304 is less than a data error tolerance). When the equalization procedure is terminated, the retimer 220 switches to the recovery clock extracted from incoming data and uses the FIR driver 310 that operate with the updated coefficients to forward the data packets received from the upstream device 302 to the downstream device 304. As such, in an example, the clock data recovery circuit 306 is enabled to use the local crystal clock to set up the FIR driver 310 in the equalization procedure, when a high speed data transmission associated with PCI Express 3.0 or above is requested and needs to be initiated, and extract the recovery clock to operate with the FIR driver 310 that has been set up in the equalization procedure, during the subsequent high speed data transmission associated with PCI Express 3.0 or above (e.g., in a fully active state L0 in FIG. 4).

Specifically, before the equalization procedure is initiated, a first sequence of data items is received from the upstream device 302, and transferred (318) via the data path 308 of the data link 120 to the downstream device 304. The FIR driver 310 adopts the default coefficient preset or a previously determined set of filtering coefficients during the course of processing the first sequence of data items, which may result in a relatively high bit error rate (e.g., $10^{-5}$). The stream of data items includes an initiation data packet indicating initiation of the equalization procedure. A controller 312 detects (320) the initialization of the equalization procedure based on the initiation data packet in the first sequence of data packets. In accordance with detection of the initiation of the equalization procedure, the retimer 220 selects a local crystal clock as a reference to generate a periodic signal. During the equalization procedure, a second sequence of data packets immediately follows the first sequence of data packets, and is transferred (322) from the upstream device 302 to the downstream device 304 via the data path 308 of the data link 120. The equalization procedure updates filtering coefficients of the FIR driver 310 based on protocol-aware equalization negotiation between the upstream and downstream components 202 and 204 (FIG. 2A) or among the upstream component 202, retimers 220B and 202C, and downstream component 204 (FIG. 2B). In some implementations, the filtering coefficients of the FIR driver 310 are finalized and the equalization procedure can be terminated, when the bit error rates are suppressed to be less than the bit error tolerance (e.g., $10^{-12}$) at each of the receiving interfaces Tx of the upstream component 202, retimer(s) 220, and downstream component 204. The second sequence of data packets is ended with a termination data packet indicating termination of the equalization procedure. In some implementations, the controller 312 detects (324) termination of the equalization procedure based on the termination data packet in the second sequence of data packets. The recovery clock is re-selected to transfer one or more subsequent sequences of data packets in collaboration with the FIR driver 310 using the updated filtering coefficients.

Figure 3B:
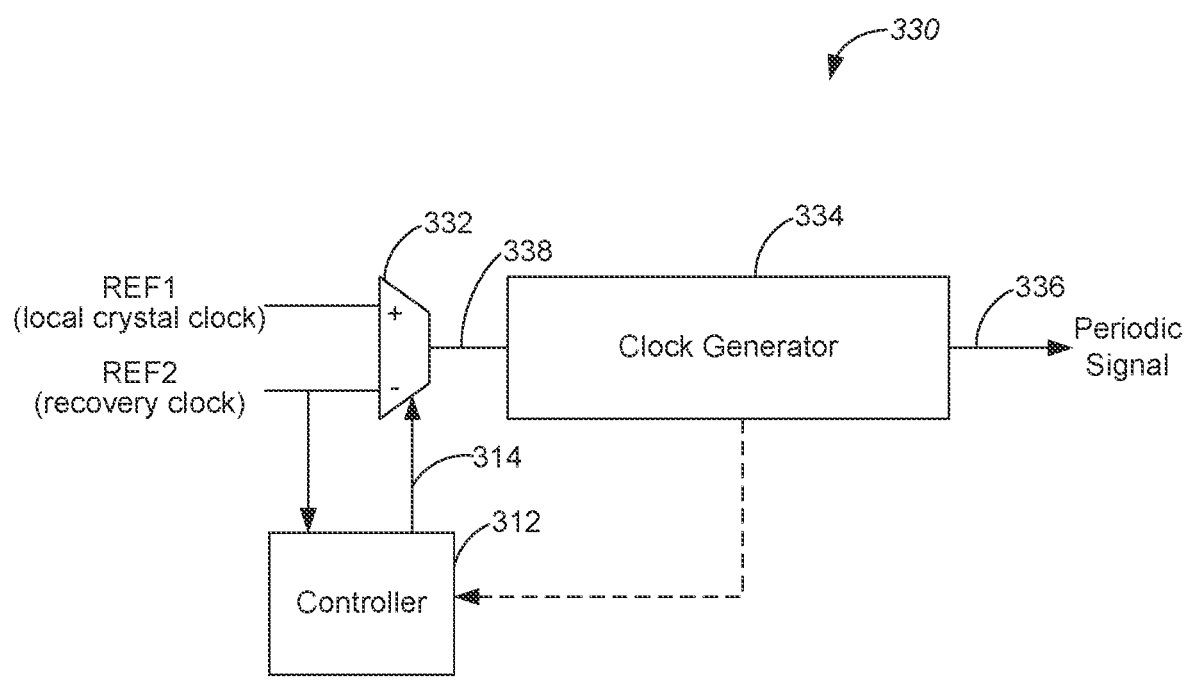
FIG. 3B is a block diagram of an example clock control circuit 330 of a retimer, in accordance with some implementations.

FIG. 3B is a block diagram of an example clock control circuit 330 of a retimer 220, in accordance with some implementations. The clock control circuit 330 includes a selector 332, a clock generator 334, and the controller 312. The clock control circuit 330 receives a first reference signal REF1 (e.g., a local crystal clock) and a second reference signal REF2 (e.g., a recovery clock), and generates a periodic signal 336 based on an input signal 338. The first reference signal REF1 has a first frequency that is substantially stable (e.g., varies less than 0.5% of the first frequency). The second reference signal REF2 has a second frequency that peaks at a peak frequency $f_P$ equal to the first frequency. The second frequency changes between the peak frequency $f_P$ and a down-spreading frequency (e.g., 95% of the peak frequency $f_P$). This input signal 338 switches between the first and second reference signals REF1 and REF2, e.g., in accordance with a determination that equalization or data transmission is executed on the retimer 220. During an equalization procedure, the first reference signal REF1 (e.g., the local crystal clock) is selected as the input signal 338 to generate the periodic signal 336. During data transmission, the second reference signal REF2 (e.g., the recovery clock) is selected as the input signal 338 to generate the periodic signal 336. The recovery clock is optionally recovered from incoming data packets received from an upstream device 302 by the clock and data recovery circuit 306.

The selector 332 is configured to receive a lock signal CK_SW 314 from the controller 312, and select one of the first reference signal REF1 and the second reference signal REF2 as the input signal 338 having an input phase under the control of the controller 312. The clock generator 334 is coupled to the selector 332, and configured to receive the input signal 338 and generate the periodic signal 336 with reference to the input signal 338. The periodic signal 336 has an output phase that matches the input phase of the input signal 338. The controller 312 is coupled to the selector 332 and configured to while the first reference signal REF1 is selected as the input signal 338, e.g., during an equalization procedure, determine whether the second reference signal REF2 is in a temporal range in which the second reference signal REF2 reaches a peak frequency $f_P$. The controller 312 is configured to control the selector 332 to select the second reference signal REF2 as the input signal 338 in accordance with a determination that the second reference signal REF2 is in the temporal range TR. In an example, the controller 312 is implemented based on a clock switch state machine.

In some implementations, the retimer 220 is configured to operate at a link training mode and a data transmission mode. In the link training mode, the retimer 220 reconfigures a receiver or transmitter portion (e.g., including a FIR driver 310) based on the periodic signal 336 that is generated from the first reference signal REF1. In the data transmission mode, the retimer 220 communicates data packets received from the upstream device 302 in synchronization with the periodic signal 336 that is generated from the second reference signal REF2.

FIG. 4 is a state diagram of a Link Training and Status State Machine (LTSSM) 400 of a data link 120, in accordance with some implementations. The LTSSM 400 has five categories of states: link training states (e.g., Detect, Polling, and Configuration), a link re-training state (e.g., Recovery), power management states (e.g., L0, L1, and L2), active power management states (e.g., L0s and L1), and other states (e.g., Disabled, Loopback, Hot Reset). Each state further includes one or more substrates. After any type of Reset exit or upon a request from a data link layer 112, the data link 120 goes through the Detect, Polling, and Configuration states sequentially and reaches the fully active state (L0) in which normal data transmission is implemented.

In some implementations, if a BER exceeds a data error tolerance in the fully active state (L0), the LTSSM 400 transitions to the Recovery state in which the data link is retrained to update settings of the FIR driver 310 via an equalization procedure 402. The first reference signal REF1 (e.g., a local crystal clock) is selected upon initiation of the equalization procedure 402, and deselected upon termination of the equalization procedure 402 (e.g., when the data link 120 returns to normal operation in the fully active state (L0)).

In some implementations, the data link 120 is a PCI Express 3.0 or above link, and an equalization procedure is performed when a data rate is increased. Each data lane 130 is configured to transmit data at different data rates including a first data rate (e.g., 0.5 Gbps) and a second data rate (e.g., 1 Gbps) that is higher than the first data rate. The data link 120 goes through the Detect, Polling, and Configuration states sequentially and reaches the fully active state (L0). In the fully active state (L0), data packets are transferred at the first data rate. In response to a request to boost up a data rate of the data link 120 to the second data rate, the data link 120 enters the Recovery state in which an equalization procedure 402 is implemented to determine equalization settings of the FIR driver 310 that can support the second data rate. The first reference signal REF1 (e.g., a local crystal clock) is selected upon initiation of the equalization procedure 402, and deselected upon termination of the equalization procedure 402 (e.g., when the equalization settings of the FIR driver 310 support the second data rate and the data link 120 returns to the fully active state (L0)). When the data link 120 returns to the fully active state (L0), a second reference signal REF2 (e.g., recovery clock) is selected, and data packets start to be transferred at the second data rate via the data path 308 of the data link 120. As such, the equalization procedure is performed at least when the BER exceeds a data error tolerance and when the data rate of the data link is increased to a higher level.

Figure 5:
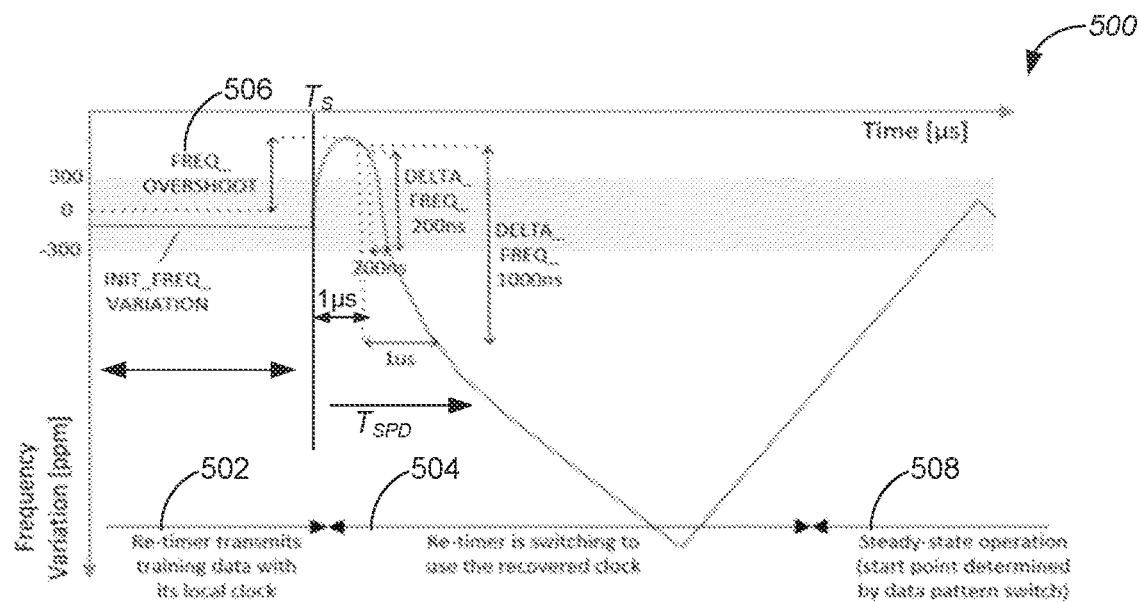
FIG. 5 is a temporal diagram of an example frequency variation of a periodic signal generated by the clock generator 334 during link training, in accordance with some implementations.

FIG. 5 is a temporal diagram of an example frequency variation 500 of a periodic signal 336 generated by the clock generator 334 during link training, in accordance with some implementations. At a switching time $T_S$, the retimer 220 switches from a link training mode to a data transmission mode. Prior to the switching time $T_S$, the clock control circuit 330 of the retimer 220 selects a first reference signal REF1 (e.g., a local crystal clock generated from a local oscillation crystal of the retimer 220) and transmits training data based on the first reference signal REF1. The first reference signal REF1 is substantially stable (e.g., within ±300 ppm of a first frequency). It is noted that the first reference REF1 is distinct from a data rate of the retimer 220. For example, the first frequency of the first reference signal REF1 and the data rate are 25 MHz and 20 GHz, respectively.

After the switching time $T_S$ and in the data transmission mode (504), the clock control circuit 330 of the retimer 220 selects a second reference signal REF2 (e.g., a recovery clock extracted from incoming data) and transmits the data based on the second reference signal REF2. The second reference signal REF2 varies periodically between a peak frequency $f_P$ equal to the first frequency and a down-spreading frequency. A second frequency of the second reference signal REF2 varies with a spreading frequency $f_{SPD}$ corresponding to a spreading period $T_{SPD}$. In prior art, the periodic signal 336 does not track the second reference signal REF2 closely. In an example, the periodic signal 336 has a frequency overshoot 506 immediately following the switching time $T_S$, and the frequency overshoot 506 is beyond ±300 ppm of an output frequency of the periodic signal 336 within a short duration of time of 1 μs. The frequency overshoot 506 settles and varies periodically after an extended duration of time of 2 μs, and the retimer 220 enters a steady-state operation 508. In some implementations, the retimer 220 determines a start point of the steady-state operation 508 based on a data pattern switch. However, the frequency overshoot 506 does not comply with high-speed serial computer expansion bus standards and has to be reduced using frequency controlling techniques as disclosed in this application.

Figure 6:
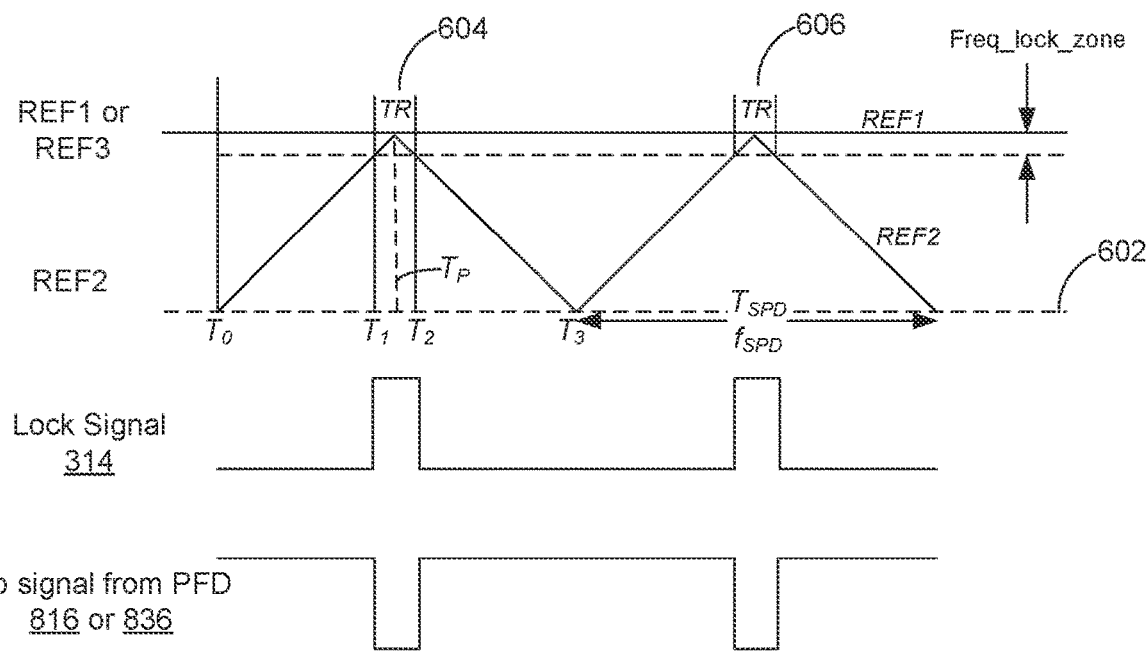
FIG. 6 is a temporal diagram of two example reference signals REF1 and REF2 that are switched in a temporal range (i.e., a clock switch zone), in accordance with some implementations.

FIG. 6 is a temporal diagram of two example reference signals REF1 and REF2 that are switched in a temporal range TR (i.e., a clock switch zone), in accordance with some implementations. As explained above, the first reference signal REF1 is substantially stable (e.g., within 30 ppm or 300 ppm of a first frequency). An example of the first frequency is 25 MHz. The second reference signal REF2 varies periodically between a peak frequency $f_P$ equal to the first frequency and a down-spreading frequency 602. A second frequency of the second reference signal REF2 varies with a spreading frequency $f_{SPD}$ corresponding to a spreading period $T_{SPD}$. In an example, the first frequency of the first reference signal REF1 is substantially equal to 25 MHz. The spreading frequency $f_{SPD}$ is substantially equal to 30 kHz, and the second frequency of the second reference signal REF2 varies, periodically with the spreading frequency $f_{SPD}$, between 25 MHz and 24.875 MHz. An output frequency of a periodic signal generated from the reference signal REF1 or REF2 is substantially equal to 20 GHz, and configured to determine a data transmission rate of the corresponding data link 102. The temporal range TR is less than 0.5% of the spreading period $T_{SPD}$. Specifically, in an example, the spreading period $T_{SPD}$ is 30-33 μs, and the temporal range TR is 0.15-0.165 μs.

During an equalization procedure in a link training mode, the first reference signal REF1 is selected as the input signal 338. A controller 312 determines whether the second reference signal REF2 is in the temporal range TR in which the second reference signal REF2 reaches the peak frequency $f_P$ (i.e., a maximum value of a second frequency of the second reference signal REF2). In accordance with a determination that the second reference signal REF2 is in the temporal range TR, the controller 312 controls the selector 332 to select the second reference signal REF2 as the input signal 338. In some implementations, the controller 312 is configured to monitor an overshoot 506 of an output frequency of a periodic signal 336 and dynamically adjust the temporal range TR based on the overshoot 506 of the output frequency of the periodic signal 336. Specifically, in an example, the controller 312 determines that the overshoot 506 of the output frequency of the periodic signal 336 exceeds a predefined overshoot tolerance (e.g., 300 ppm) and reduces the temporal range TR to control the overshoot 506 within the predefined overshoot tolerance.

In the temporal range TR, a second frequency of the second reference signal RFE2 increases to the peak frequency $f_P$ and decreases from the peak frequency $f_P$. While the first reference signal REF1 is selected as the input signal 338, the controller 312 determines that the frequency of the second reference signal REF2 is rising towards the peak frequency $f_P$ during the temporal range TR. The selector 332 is controlled by the controller 312 to select the second reference signal REF2 in place of the first reference signal REF1 in accordance with a determination that the frequency of the second reference signal REF2 is rising towards the peak frequency $f_P$ in the temporal range TR.

In some implementations, data are transmitted via the retimer 220 after the second reference signal REF2 is selected until a system reset signal is enabled. The controller 312 is configured to receive a system reset signal and determine whether the system reset signal is enabled while the first reference signal REF1 is being selected as the input signal 338. The selector 332 is controlled by the controller 312 to select the second reference signal REF2 in place of the first reference signal REF1 in accordance with a determination that the system reset signal is disabled and a determination that the second reference signal REF2 is in the temporal range TR. Additionally, in some situations, the selector 332 is controlled by the controller 312 to, while the second reference signal REF2 is selected as the input signal 338, select the first reference signal REF1 in accordance with a determination that the system reset signal is enabled.

Figure 7:
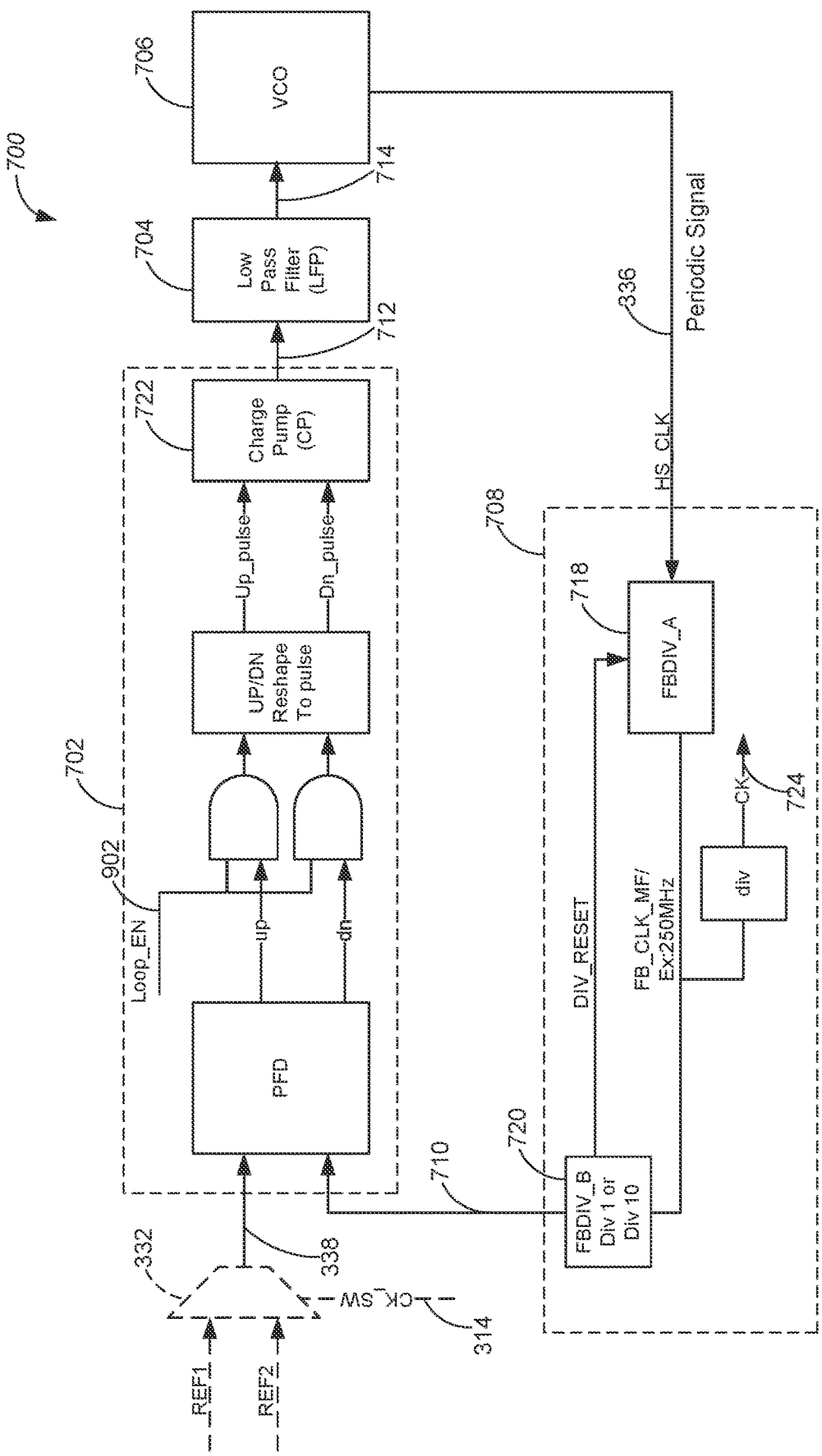
FIG. 7 is a block diagram of an example phase lock loop (PLL) that generates a periodic signal with reference to two selectable reference signals, in accordance with some implementations.

FIG. 7 is a block diagram of an example PLL 700 that generates a periodic signal 336 with reference to two selectable reference signals REF1 and REF2, in accordance with some implementations. The clock generator 334 is implemented using the PLL 700, and the PLL 700 is coupled to the selector 332 to select one of the reference signals REF1 and REF2 as the input signal 338. The PLL 700 further includes a PLL frequency or phase comparator 702, a loop filter 704, a voltage controlled oscillator (VCO) 706, and a feedback path 708. The PLL frequency or phase comparator 702 is configured to receive the input signal 338 and a feedback clock 710 and generate a PLL comparison signal 712. The loop filter 704 is coupled to the PLL frequency or phase comparator 702, and configured to generate a DC difference voltage 714 based on the PLL comparison signal 712. Optionally, a magnitude of the DC difference voltage 714 depends on a difference of frequencies of the input signal 338 and feedback clock 710. Optionally, the magnitude of the DC difference voltage 714 depends on a difference of phases of the input signal 338 and feedback clock 710. The VCO 706 is coupled to the loop filter 704, and configured to generate the periodic signal 336 based on the DC difference voltage 714.

The feedback path 708 is coupled to the VCO 706 and PLL frequency or phase comparator 702, forming a negative feedback loop in which the feedback path 708 converts the periodic signal 336 to the feedback clock 710 and feeds the feedback clock 710 to the PLL frequency or phase comparator 702. In some implementations, as the difference of the frequencies of the input signal 338 and feedback clock 710 increases, the DC difference voltage 714 increases to compensate the difference, thereby driving the frequency of the feedback clock 710 towards the frequency of the input signal 338. In some implementations, as the difference of the phases of the input signal 338 and feedback clock 710 increases, the DC difference voltage 714 increases to compensate the difference, thereby driving the phase of the feedback clock 710 towards the phase of the input signal 338.

In some implementations, an output frequency of the periodic signal 336 is greater than, and equal to an integer multiple of, an input frequency of the input signal 338. For example, the output frequency of the periodic signal 336 is substantially equal to 20 GHz, and the first frequency of the selected first reference signal REF1 is substantially equal to 25 MHz. The feedback path 708 includes a first feedback divider 718 and a second feedback divider 720 coupled in series with the first feedback divider 718. The first feedback divider 718 is configured to scale down the output frequency of the periodic signal 336 by a first integer multiple, and the second feedback divider 720 is configured to scale down the output frequency of the periodic signal 336 further by a second integer multiple. In an example, the first and second integer multiples are equal to 80 and 10. The first feedback divider 718 reduces the output frequency of 20 GHz to 250 MHz, and the second feedback divider 720 further reduces the frequency of 250 MHz to 25 MHz.

Additionally, in some implementations, the PLL frequency or phase comparator 702 further includes a charge pump circuit 722 coupled to the loop filter 704. The charge pump 722 is configured to control a variation rate of the DC difference voltage 714. In response to the input signal 338 being switched from the first reference signal REF1 to the second reference signal REF2. An overshoot 506 on an output frequency of the periodic signal 336 is controlled to be less than a predefined portion of the output frequency of the periodic signal 336 (e.g., 300 ppm).

Referring to FIG. 7, in a link training mode, an equalization procedure is implemented to determine device configurations of a corresponding data direction 140 or 150. The first reference signal REF1 is provided by a local oscillation crystal embedded in a retimer 220, and selected to act as the input signal 338 in the link training mode. Conversely, as the link training mode switches to a data transmission mode, e.g., at a switching time $T_S$, the second reference signal REF2 is selected to act as the input signal 338. In some implementations the second reference signal REF2 is a recovery clock recovered from incoming data received by the retimer 220, and the recovery clock is modulated with spread-spectrum clocking. The second reference signal REF2 has a second frequency that varies periodically between the peak frequency $f_P$ and a down-spreading frequency 602 lower than the peak frequency $f_P$.

Figure 8A:
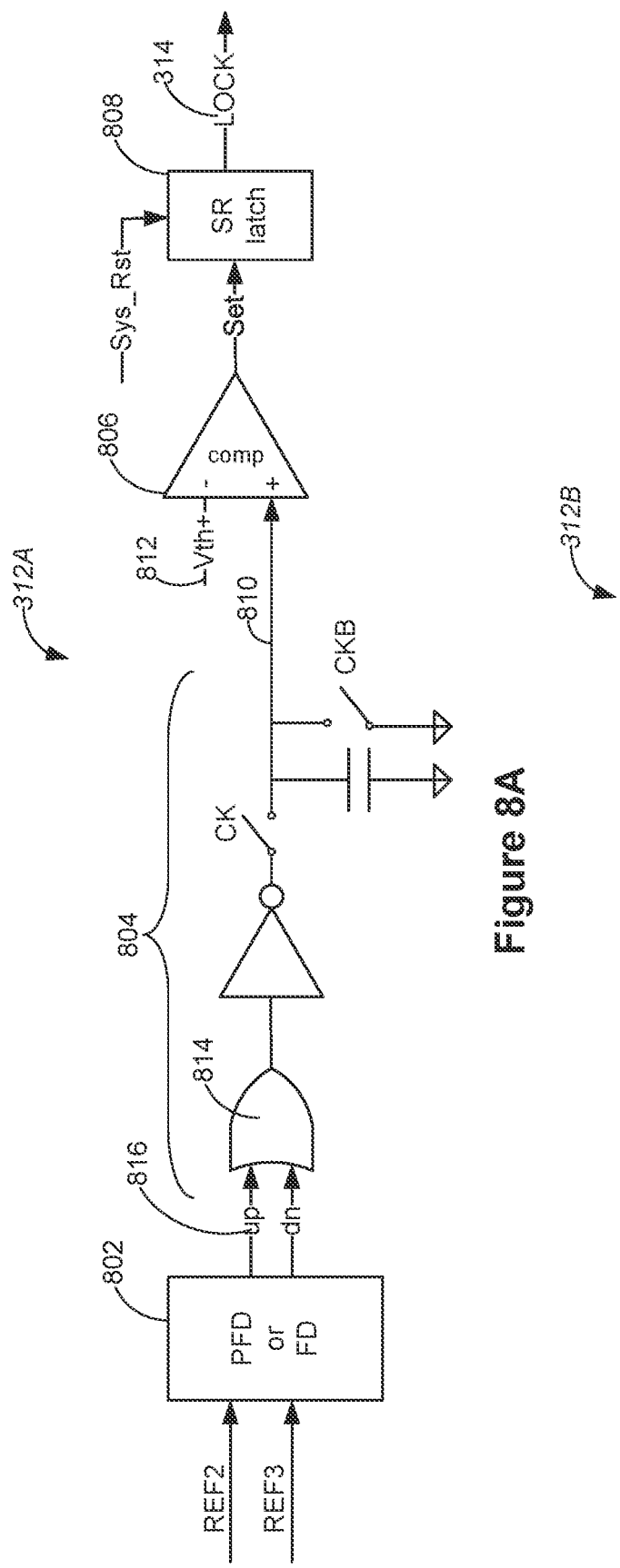
FIGS. 8A and 8B are block diagrams of example controllers that generate lock signals for selecting a reference signal in a PLL, in accordance with some implementations.
Figure 8B:
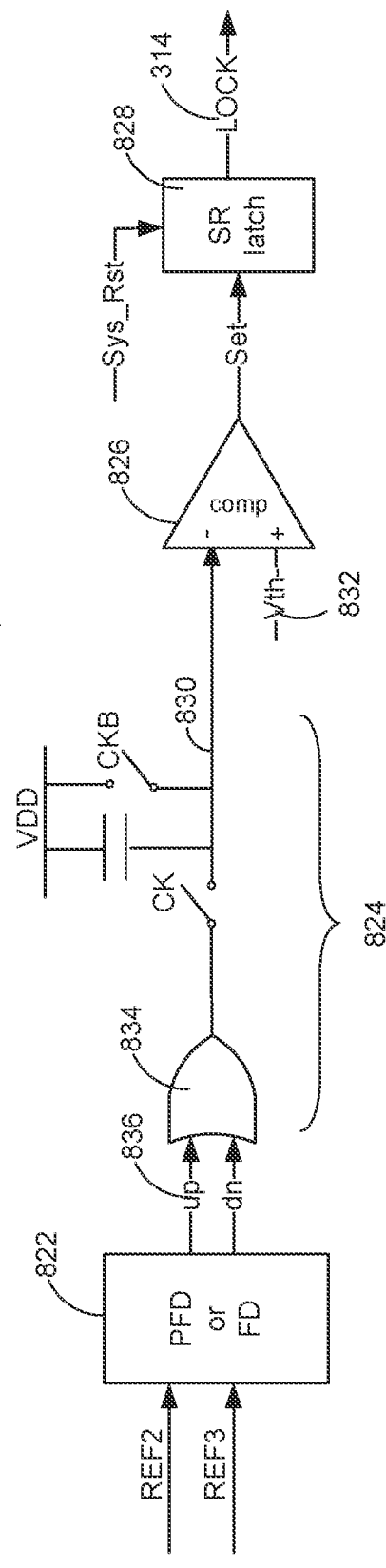

FIGS. 8A and 8B are block diagrams of example controllers 312 that generate lock signals 314 for selecting a reference signal REF1 or REF2 in a PLL 700, in accordance with some implementations. Referring to FIG. 8A, in some implementations, a retimer 220 operates in a link training mode. The controller 312A includes a frequency or phase difference detector 802 (also called a phase frequency detector (PFD)), an integrator 804, a comparator 806, and a lock latch 808. The frequency or phase difference detector 802 is configured to detect a frequency or phase difference between the second reference signal REF2 and a third reference signal REF3 (e.g., the feedback clock 710 in FIG. 7). The integrator 804 is coupled to the frequency or phase difference detector 802 and configured to generate a lock voltage 810 that increases in response to detection of the frequency or phase difference of the second and third reference signals REF2 and REF3. The comparator 806 is coupled to the integrator 804 and configured to compare the lock voltage 810 with a lock threshold 812 associated with the temporal range TR. The lock latch 808 is coupled to the comparator 806 and configured to in accordance with a determination that the lock voltage 810 exceeds the lock threshold 812, enable a lock signal 314 for controlling the selector 332 to select the second reference signal REF2 as the input signal 338.

Referring to FIG. 6, starting from an initial time $T_0$, an up signal 816 generated by the frequency or phase difference detector 802 is high, and the lock signal 314 outputted by the controller 312 is low, such that the first reference signal REF1 is still selected as the input signal 338 to implement the equalization procedure. The temporal range TR is defined as a range in which the second reference signal REF2 reaches a first frequency $f_P-\Delta$, rises to a peak frequency $f_P$, and returns to the first frequency $f_P-\Delta$. The lock voltage 810 generated by the integrator 804 increases from the down spreading frequency 602 and hits the lock threshold 812 in the temporal range TR, when or after a second frequency of the second reference signal REF2 reaches the first frequency $f_P-\Delta$ at a first time Ti. In some implementations, the input signal 338 is switched to the second reference signal REF2 during either a frequency rising portion or a frequency falling portion of the temporal range TR. In some implementations, the input signal 338 is switched to the second reference signal REF2 only during a frequency rising portion in the time range TR.

In some situations, the initial time $T_0$ corresponds to a system reset signal that is enabled in the link training mode and disabled in the data communication mode of the retimer 220. After the system reset signal is disabled at the initial time $T_0$, the input signal 338 switches from the first reference signal REF1 to the second reference signal REF2 in a first temporal rang TR 604 following the initial time $T_0$ or a subsequent temporal range TR 606 following the first temporal range TR 604.

Additionally, in some implementations, after the input signal 338 switches to the second reference signal REF2 in one of the temporal ranges TR, the input signal 338 operates with spread-spectrum clocking as the second reference signal REF2, so is the periodic signal 336 outputted by the clock generator 334 (e.g., PLL 700). In the data communication mode, in accordance with a determination that the system reset signal is enabled, the selector 332 is controlled by the controller 312 to select the first reference signal REF1 in place of the second reference signal REF2, and the retimer 220 switches to the link training mode in which the equalization procedure is performed on the retimer 220.

Referring to FIG. 8B, in some implementations, the controller 312B includes a frequency or phase difference detector 822, an integrator 824, a comparator 826, and a lock latch 828. The frequency or phase difference detector 822 is configured to detect a frequency or phase difference between the second reference signal REF2 and a third reference signal REF3 (e.g., the feedback clock 710 in FIG. 7). The integrator 824 is coupled to the frequency or phase difference detector 822 and configured to generate a lock voltage 830 that drops from a voltage rail (e.g., a high supply voltage VDD) in response to detection of the frequency or phase difference of the second and third reference signals REF2 and REF3. The comparator 826 is coupled to the integrator 804 and configured to compare the lock voltage 830 with a lock threshold 832 associated with the temporal range TR. The lock latch 808 is coupled to the comparator 826 and configured to, in accordance with a determination that the lock voltage 810 drops below the lock threshold 812, enable a lock signal 314 for controlling the selector 332 to select the second reference signal REF2 as the input signal 338.

In some implementations, the frequency or phase difference detector 802 or 822 includes a frequency difference detector configured to detect a frequency difference between the second and third frequency signals REF2 and REF3, and the integrator includes an OR logic 814 or 834 coupled to the frequency difference detector 802 or 822 to enable integration within the integrator 804 or 824, respectively. Alternatively, in some implementations, the integrator 804 or 824 includes an NAND logic used to implement the OR logic 814 or 834, respectively.

In some implementations, the frequency or phase difference detector 802 or 822 includes a phase difference detector configured to detect a phase difference between the second and third frequency signals REF2 and REF3, and the integrator 804 or 824 includes an OR logic coupled to the phase difference detector 802 to enable integration within the integrator 804 or 824. In some implementations, the clock generator 334 (e.g., PLL 700) is further configured to divide the periodic signal 336 to generate the third reference signal REF3 (e.g., the feedback clock 710, a reference clock 724), and the controller 312 is configured to receive the third reference signal REF3 from the clock generator 334. In some implementations, the controller 312 is configured to monitor an overshoot 506 of an output frequency of the periodic signal 336 and dynamically adjust the lock threshold 812 or 832 based on the overshoot 506 of the output frequency of the periodic signal 336.

Figure 9:
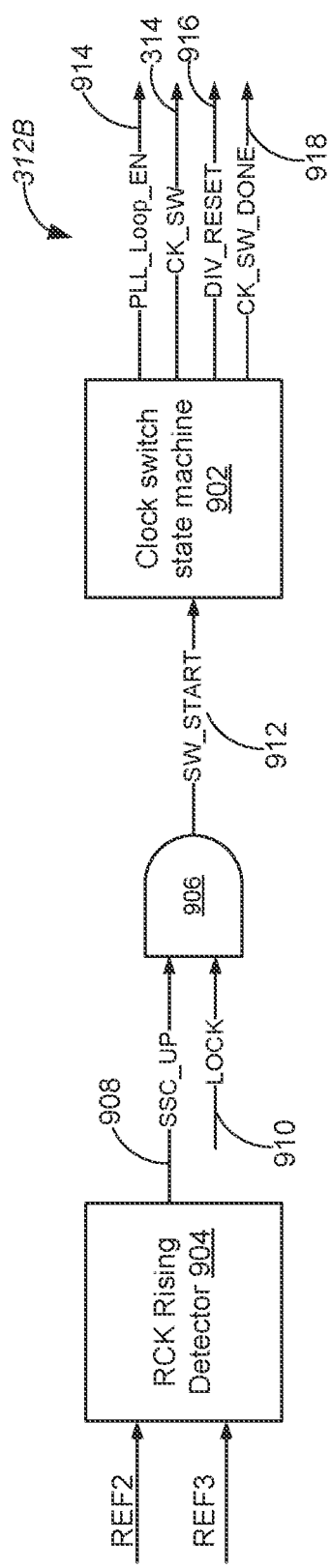
FIG. 9 is a block diagram of a controller that controls frequency switching based on a state machine, in accordance with some implementations.
Figure 10:
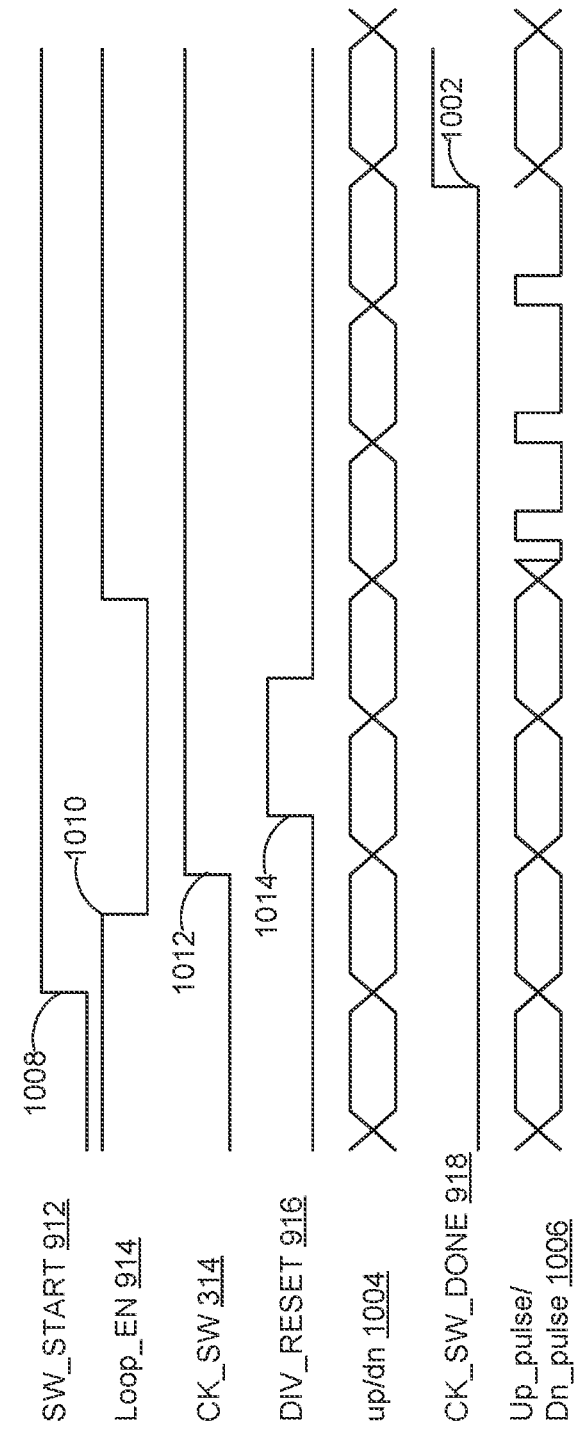
FIG. 10 illustrate signal levels of a plurality of example signals involved in frequency switching, in accordance with some implementations.

FIG. 9 is a block diagram of a controller 312 that controls frequency switching based on a state machine 902, in accordance with some implementations, and FIG. 10 illustrate signal levels of a plurality of example signals 1000 involved in frequency switching, in accordance with some implementations. The controller 312 includes an RCK rising detector 904, a logic block 906, and the state machine 902. The RCK rising detector 904 is configured to track, and generate a frequency rising signal 908 indicating, whether a second frequency of the second reference signal REF2 increases, e.g., whether the second reference signal REF2 is in a frequency rising range, i.e., from the initial time $T_0$ to a peak frequency time $T_P$. In some implementations, in a link training mode, the third reference signal REF3 includes a feedback clock 710 or reference clock 724 in FIG. 7. Both of the feedback clock 710 and reference clock 724 are derived from the periodic signal 336 that is substantially stable. A frequency difference of the second and third reference signals REF2 and REF3 is monitored to determine whether the second reference signal REF2 is in the frequency rising range from the initial time $T_0$ and peak frequency time $T_P$.

The logic block 906 (e.g., an AND logic) combines the frequency rising signal 908 and lock enable signal 910 to generate a switch enable 912. The switch enable 912 controls the state machine 902 to generate one or more of: a PLL loop enable 914, a lock signal CK_SW 314, a divider reset 916, and a lock complete 918. The PLL loop enable 914 is configured to control the PLL 700 to output the periodic signal 336. The lock signal CK_SW 314 is configured to control the selector 332 to select the first or second reference signal REF1 or REF2 as the input signal 338. The divider reset 916 is configured to control dividers used in the PLL 700. The lock complete 918 is configured to lock the second reference signal REF2 to be outputted as the input signal 338. After the lock complete 918 is enabled (1002), the second reference signal REF2 is optionally disabled to be outputted as the input signal 338. In some implementations, only after the lock complete 918 is enabled, the link training mode is enabled, and the first reference signal REF1 is selected to as the input signal 338.

Referring to FIG. 10, the signals 1000 include the switch enable 912, PLL loop enable 914, lock signal CK_SW 314, divider reset 916, up and down controls 1004, lock complete 918, and up and down pulse signals 1006. The retimer 220 uses a frequency or phase difference detector 802 or 822 to compare the second reference signal REF2 modulated with spread-spectrum clocking and the third reference signal REF3 to generate the lock signal CK_SW 314. The second reference signal REF2 is down spreading. Logic blocks 904 and 906 are applied to determine whether the second reference signal REF2 is rising toward to a first frequency of the first reference signal REF1. The frequency rising signal 908 is high as the second reference signal REF2 is rising toward to the first frequency, and low as the second reference signal REF2 is dropping toward to the down-spreading frequency 602. The frequency rising signal 908 determines the switch enable 912. After the switch enable 912 is enabled (1008), the retimer 220 stops (1010) the PLL loop 700 and starts (1012) clock switching based on the lock signal CK_SW 314. One or more feedback dividers 718 and 720 are reset (1014) to minimize a phase difference during the course of generating the feedback clock 710. After reset release (1016), the retimer 220 re-shapes the up and down controls 1004, thereby reducing a PLL loop bandwidth at a pull-in period in which the input signal of the PLL is switched to reach the recovery clock, particularly for a skip cycle case. After certain delay or using an accurate frequency loss of lock check, the lock complete 918 is applied to make the PLL 700 to return to a normal bandwidth that is defined by the recovery clock to transmit data in the data transmission mode.

Figure 11:
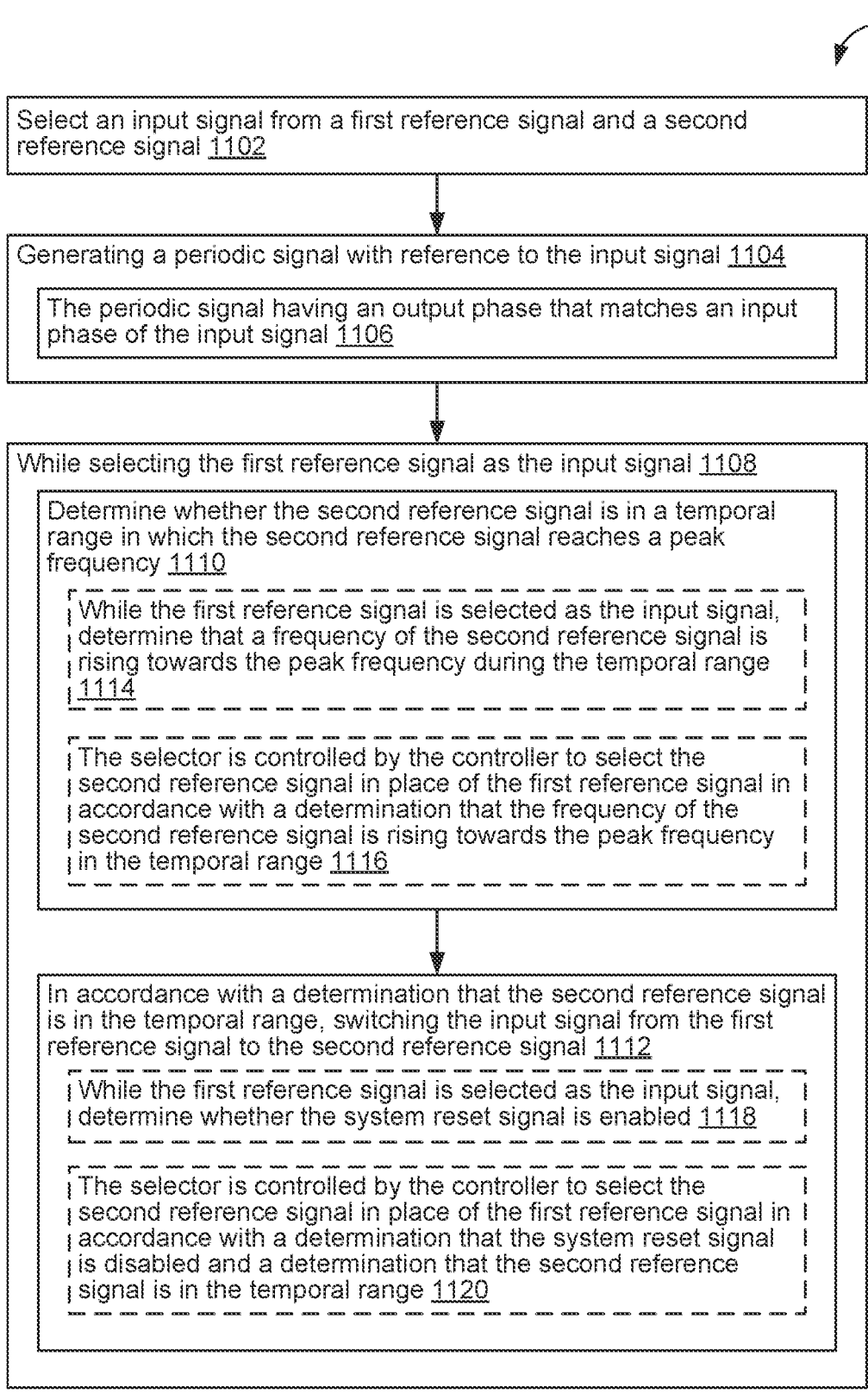
FIG. 11 is a flow diagram of an example method of controlling frequency in an electronic device (e.g., a data link, a data interface), in accordance with some implementations.

FIG. 11 is a flow diagram of an example method 100 of controlling frequency in an electronic device (e.g., a data link, a data interface), in accordance with some implementations. The electronic device includes a retimer 220. The electronic device selects (1102) an input signal 338 from a first reference signal REF1 and a second reference signal REF2, and generates (1104) a periodic signal 336 with reference to the input signal 338. The periodic signal 336 has (1106) an output phase that matches an input phase of the input signal 338. While selecting (1108) the first reference signal REF1 as the input signal 338, the electronic device determines (1110) whether the second reference signal REF2 is in a temporal range TR in which the second reference signal REF2 reaches a peak frequency $f_P$. In accordance with a determination that the second reference signal REF2 is in the temporal range TR, the electronic device switches (1112) the input signal 338 from the first reference signal REF1 to the second reference signal REF2.

In some implementations, the electronic device determines whether the second reference signal REF2 is in the temporal range TR by while the first reference signal REF1 is selected as the input signal 338, determining (1114) that a frequency of the second reference signal REF2 is rising towards the peak frequency $f_P$ during the temporal range 77. The selector 332 is controlled by the controller 312 to select (1116) the second reference signal REF2 in place of the first reference signal REF1 in accordance with a determination that the frequency of the second reference signal REF2 is rising towards the peak frequency $f_P$ in the temporal range TR.

In some implementations, the controller 312 is further configured to receive a system reset signal. While the first reference signal REF1 is selected as the input signal, the electronic device determines (1118) whether the system reset signal is enabled. The selector 332 is controlled (1120) by the controller 312 to select the second reference signal REF2 in place of the first reference signal REF1 in accordance with a determination that the system reset signal is disabled and a determination that the second reference signal REF2 is in the temporal range TR.

In some implementations, the first reference signal REF1 has a first frequency that is substantially stable. The peak frequency $f_P$ is equal to the first frequency. Further, in some implementations, the second reference signal REF2 has a second frequency that varies periodically between the peak frequency $f_P$ and a down-spreading frequency 602. Additionally, the second frequency of the second reference signal REF2 varies with a spreading frequency $f_{SPD}$ corresponding to a spreading period $T_{SPD}$. The controller 312 is configured to monitor an overshoot of an output frequency of the periodic signal and dynamically adjust the temporal range TR based on the overshoot 506 of the output frequency of the periodic signal 336. In an example, the output frequency of the periodic signal 336 is substantially equal to 20 GHz. The first frequency of the first reference signal REF1 is substantially equal to 25 MHz. The spreading frequency $f_{SPD}$ is substantially equal to 30 kHz. The second frequency of the second reference signal REF2 varies, periodically with the spreading frequency, between 25 MHz and 24.875 MHz. The temporal range TR is less than 0.5% of the spreading period $T_{SPD}$.

In some implementations, the clock generator 334 further includes a PLL 700, and the PLL 700 further includes a PLL frequency or phase comparator 702, a loop filter 704, a VCO 706, and a feedback path 708. The PLL frequency or phase comparator 702 is configured to receive the input signal 338 and a feedback clock 710 and generate a PLL comparison signal 712. The loop filter 704 is coupled to the PLL frequency or phase comparator 702, and configured to generate a DC difference voltage 714 based on the PLL comparison signal 712. The VCO 706 is coupled to the loop filter 704, and configured to generate the periodic signal 336 based on the DC difference voltage 714. The feedback path 708 is coupled to the VCO 706 and PLL frequency or phase comparator 702, and configured to convert the periodic signal 336 to the feedback clock 710 and feed the feedback clock 710 to the PLL frequency or phase comparator 702.

Further, in some implementations, the PLL further includes a charge pump circuit 722 coupled to the loop filter 704. The charge pump 722 is configured to control a variation rate of the DC difference voltage 714, such that in response to the input signal 338 being switched from the first reference signal REF1 to the second reference signal REF2. An overshoot 506 on an output frequency of the periodic signal 336 is less than a predefined portion of the periodic frequency.

Referring to FIG. 8A, in some implementations, the controller 312 further includes a frequency or phase difference detector 802, an integrator 804, a comparator 806, and a lock latch 808. The frequency or phase difference detector 802 is configured to detect a frequency or phase difference between the second reference signal REF2 and a third reference signal REF3. The integrator 804 is coupled to the frequency difference detector 802 and configured to generate a lock voltage that increases in response to detection of the frequency or phase difference of the second and third reference signals REF2 and REF3. The comparator 806 is coupled to the integrator 804, and configured to compare the lock voltage with a lock threshold associated with the temporal range TR. The lock latch 808 is coupled to the comparator, and configured to in accordance with a determination that the lock voltage 810 exceeds the lock threshold 812, enable a lock signal 314 for controlling the selector 332 to select the second reference signal REF2 as the input signal 338. In some implementations, the clock generator 334 is further configured to divide the periodic signal 336 to generate the third reference signal REF2, and the controller 312 is configured to receive the third reference signal REF3 from the clock generator 334. In some implementations, the controller 312 is configured to monitor an overshoot 506 of an output frequency of the periodic signal 336 and dynamically adjust the lock threshold 812 based on the overshoot 506 of the output frequency of the periodic signal 336.

Further, in some implementations, the frequency or phase difference detector 802 includes a frequency difference detector configured to detect a frequency difference between the second and third frequency signals, and the integrator 804 includes an OR logic coupled to the frequency difference detector 802 to enable integration within the integrator 804. Alternatively, in some implementations, the frequency or phase difference detector 802 includes a phase difference detector configured to detect a phase difference between the second and third frequency signals REF2 and REF3, and the integrator 804 includes an OR logic coupled to the frequency difference detector to enable integration within the integrator. It is noted that, in some implementations, the integrator 804 includes an NAND logic used to implement the OR logic.

Referring to FIG. 8B, in some implementations, the controller 312 further includes a frequency or phase difference detector 822, an integrator 824, a comparator 826, and a lock latch 828. The frequency or phase difference detector 822 is configured to detect a frequency or phase difference between the second reference signal REF2 and a third reference signal REF3. The integrator 824 is coupled to the frequency difference detector 822, and configured to generate a lock voltage 830 that decreases from a voltage rail in response to detection of the frequency or phase difference of the second and third reference signals REF2 and REF3. The comparator 826 is coupled to the integrator 824, and configured to compare the lock voltage 830 with a lock threshold 832 associated with the temporal range TR. The lock latch 828 is coupled to the comparator 826, and configured to in accordance with a determination that the lock voltage 830 drops below the lock threshold 832, enable a lock signal 314 for controlling the selector 332 to select the second reference signal REF2 as the input signal 338.

In some implementations, in response to the input signal 338 being switched from the first reference signal REF1 to the second reference signal REF2, the periodic signal 336 has an overshoot 506 on an output frequency of the periodic signal 336, and the overshoot 506 is less than a predefined portion of the peak frequency $f_P$ (e.g., 1400 ppm, 300 ppm).

In some implementations, the selector 332, clock generator 334, and controller 312 are integrated on a single substrate. In some implementations, the selector 332, clock generator 334, and controller 331 are formed on two or three substrates and integrated in a single semiconductor package.

In some implementations, the electronic device further includes a data link 120 having a retimer 220. The retimer 220 includes a transmitter portion (e.g., FIR driver 310), a receiver portion, the selector 332, the clock generator 334, and the controller 312. The retimer 220 is configured to operate at a link training mode and a data transmission mode, reconfigure the receiver or transmitter portion based on the periodic signal 336 that is generated from the first reference signal REF1 during the training mode, and communicate data in synchronization with the periodic signal 336 that is generated from the second reference signal REF2 during the data transmission mode.

It should be understood that the particular order in which the operations in each of FIGS. 1-10 have been described are merely exemplary and are not intended to indicate that the described order is the only order in which the operations could be performed. One of ordinary skill in the art would recognize various ways to controlling frequency in a data link 120 including a retimer 220 as described herein.

Figure 12:
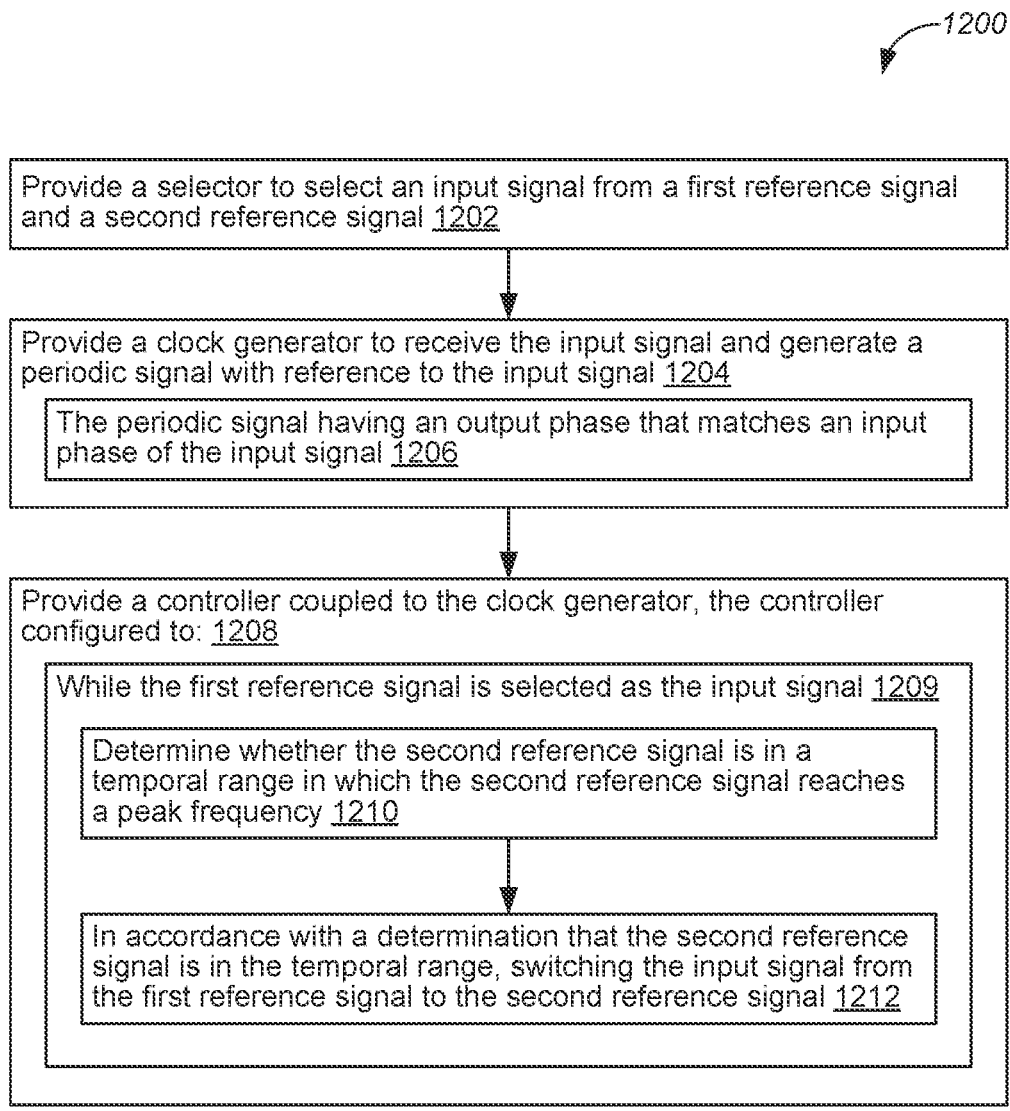
FIG. 12 is a flow diagram of an example method of providing an electronic device (e.g., a data link, a data interface) for frequency controlling, in accordance with some implementations.

FIG. 12 is a flow diagram of an example method 1200 of providing an electronic device (e.g., a data link, a data interface) for frequency controlling, in accordance with some implementations. The electronic device includes a retimer 220. A selector is provided (1202) to select an input signal 338 from a first reference signal REF1 and a second reference signal REF2. A clock generator 334 is provided (1204) to receive the input signal 338 and generate a periodic signal 336 with reference to the input signal 338. The periodic signal 336 has (1206) an output phase that matches an input phase of the input signal 338. A controller 312 is provided (1208) to be coupled to the clock generator 334. The controller 312 is configured to, while the first reference signal REF1 is selected (1209) as the input signal 338, determine (1210) whether the second reference signal REF2 is in a temporal range TR in which the second reference signal REF2 reaches a peak frequency $f_P$. The controller 312 is configured to in accordance with a determination that the second reference signal REF2 is in the temporal range TR, switch (1212) the input signal 338 from the first reference signal REF1 to the second reference signal REF2.

In some implementations, the clock generator 334 is provided by providing a PLL 700 including a PLL frequency or phase comparator 702, a loop filter 704, a VCO 706, and a feedback path 708. The PLL frequency or phase comparator 702 is provided to receive the input signal 338 and a feedback clock 710 and generate a PLL comparison signal 712. The loop filter 704 is provided to be coupled to the PLL frequency or phase comparator 702 and generate a DC difference voltage 714 based on the PLL comparison signal 712. The VCO 706 is provided to be coupled to the loop filter 704 and generate the periodic signal 336 based on the DC difference voltage 714. The feedback path 708 is provided to be coupled to the VCO 706 and PLL frequency or phase comparator 702, convert the periodic signal 336 to the feedback clock 710, and feed the feedback clock 710 to the PLL frequency or phase comparator 702.

Further, in some implementations, a charge pump circuit 722 is provided to be coupled to the loop filter 704 and control a variation rate of the DC difference voltage 714, such that in response to the input signal 338 being switched from the first reference signal REF1 to the second reference signal REF2. An overshoot 506 on an output frequency of the periodic signal 336 is less than a predefined portion of the output frequency.

In some implementations, the controller 312 further includes a frequency or phase difference detector 802, an integrator 804, a comparator 806, and a lock latch 808. The frequency or phase difference detector 802 is provided to detect a frequency or phase difference between the second reference signal REF2 and a third reference signal REF3. The integrator 804 is provided to be coupled to the frequency difference detector 802 and generate a lock voltage 810 that increases in response to detection of the frequency or phase difference of the second and third reference signals REF2 and REF3. The comparator 806 is provided to be coupled to the integrator 804 and compare the lock voltage 810 with a lock threshold 812 associated with the temporal range TR. The lock latch 808 is provided to be coupled to the comparator 806 and, in accordance with a determination that the lock voltage 810 exceeds the lock threshold 812, enable a lock signal 314 for controlling the selector 332 to select the second reference signal REF2 as the input signal 338.

In some implementations, the controller 312 further includes a frequency or phase difference detector 822, an integrator 824, a comparator 826, and a lock latch 828. The frequency or phase difference detector 822 is provided to detect a frequency or phase difference between the second reference signal REF2 and a third reference signal REF3. The integrator 824 is provided to be coupled to the frequency difference detector 822 and generate a lock voltage 830 that decreases from a voltage rail in response to detection of the frequency or phase difference of the second and third reference signals REF2 and REF3. The comparator 826 is provided to be coupled to the integrator 824 and compare the lock voltage 830 with a lock threshold 832 associated with the temporal range TR. The lock latch 828 is provided to be coupled to the comparator 826 and, in accordance with a determination that the lock voltage 830 drops below the lock threshold 832, enable a lock signal 314 for controlling the selector 332 to select the second reference signal REF2 as the input signal 338.

In some implementations, a single substrate is provided to integrate the selector 332, clock generator 334, and controller 331. In some implementations, a single semiconductor package is provided to integrate two or three substrates where the selector 332, clock generator 334, and controller 331 are formed.

In some implementations, a data link 120 having a retimer 220 is provided to include a transmitter portion (e.g., FIR driver 310), a receiver portion, the selector 332, the clock generator 334, and the controller 312. The retimer 220 is provided to operate at a link training mode and a data transmission mode, reconfigure the receiver or transmitter portion based on the periodic signal 336 that is generated from the first reference signal REF1 during the training mode, and communicate data in synchronization with the periodic signal 336 that is generated from the second reference signal REF2 during the data transmission mode.

It should be understood that the particular order in which the operations in each of FIGS. 11 and 12 have been described are merely exemplary and are not intended to indicate that the described order is the only order in which the operations could be performed. One of ordinary skill in the art would recognize various ways to providing an electronic device for frequency controlling as described herein. Additionally, it should be noted that details of other processes and structures described above with respect to FIGS. 1-10 are also applicable in an analogous manner to method 1100 or 1200 described above with respect to FIG. 11 or 12. For brevity, these details are not repeated here.

Figure 13:
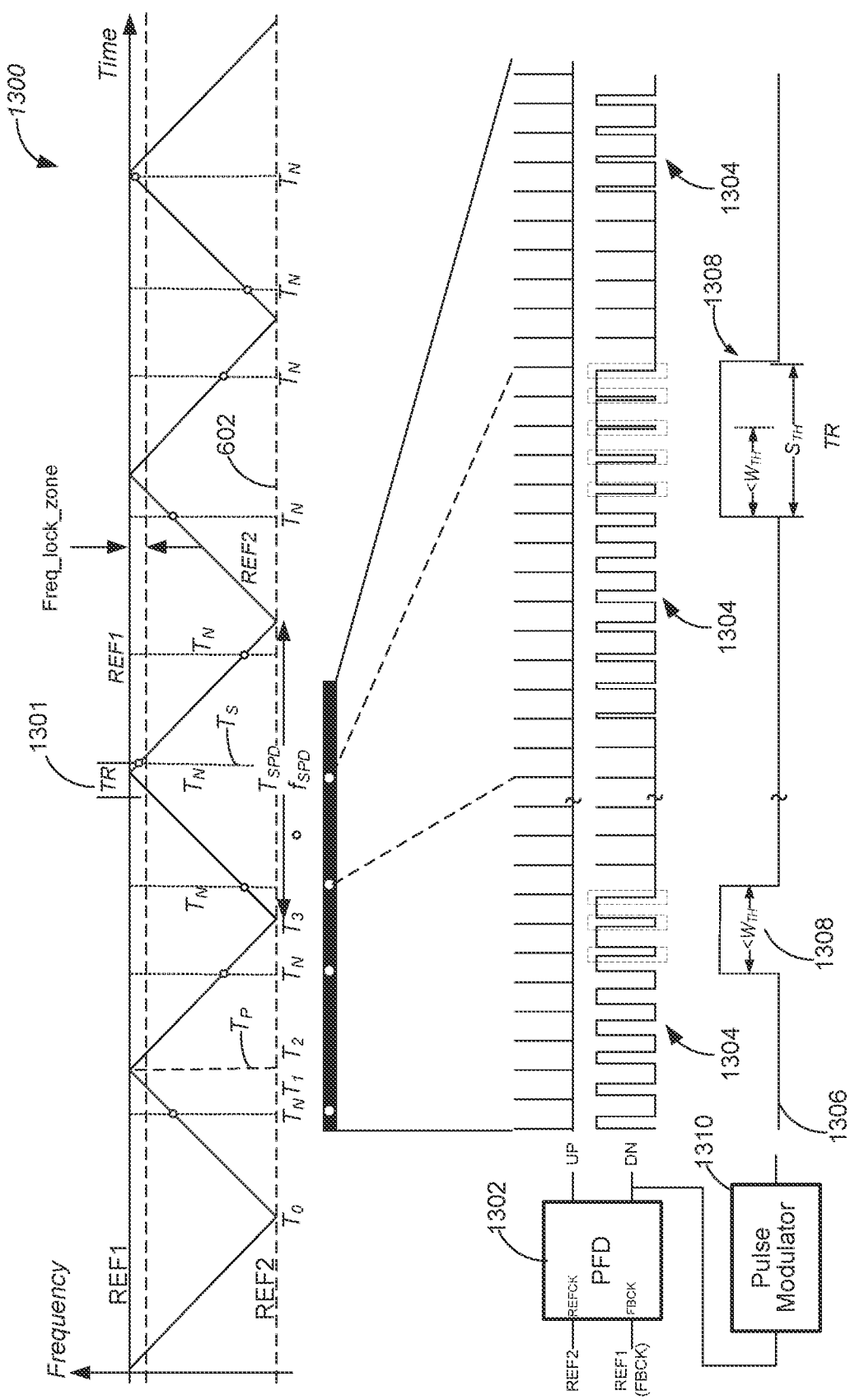
FIG. 13 is a temporal diagram of two example reference signals that are switched in a temporal range under the control of a phase frequency detector of a controller, in accordance with some implementations.

FIG. 13 is a temporal diagram 1300 of two example reference signals REF1 and REF2 that are switched in a temporal range TR under the control of a phase frequency detector (PFD) 1302 of a controller 312, in accordance with some implementations. The first reference signal REF1 is substantially stable (e.g., within ±30 ppm or ±300 ppm of a first frequency). An example of the first frequency is 25 MHz. The second reference signal REF2 varies periodically between a peak frequency f equal to the first frequency and a down-spreading frequency 602. An example of the down-spreading frequency 602 is equal to 24.875 MHz (e.g., 99.5% of the first frequency). A second frequency of the second reference signal REF2 varies with a spreading frequency $f_{SPD}$ corresponding to a spreading period $T_{SPD}$. In an example, the spreading frequency $f_{SPD}$ is substantially equal to 30 kHz, and the second frequency of the second reference signal REF2 varies, periodically with the spreading frequency $f_{SPD}$, between 25 MHz and 24.875 MHz. An output frequency of a periodic signal 336 (FIG. 3B) is generated by a clock generator 334 from the reference signal REF1 or REF2, and determines a data transmission rate of the corresponding data link 102 (FIGS. 2A and 2B).

In some implementations, the first reference signal REF1 is selected as the input signal 338, e.g., during an equalization procedure in a link training mode. A controller 312 identifies a temporal range TR including a peak instant $T_P$ (also called a peak instant $T_P$) at which the second reference signal REF2 reaches a peak frequency $f_P$. The peak instant $T_P$ has a known temporal position with respect to the temporal range TR In an example, the temporal range $T_R$ is less than 0.5% of the spreading period $T_{SPD}$. Specifically, the spreading period $T_{SPD}$ is 30-33 μs, and the temporal range TR is 0.15-0.165 μs. A controller 312 identifies the temporal range TR including the peak instant $T_P$ and selects a switching instant $T_S$ within the temporal range TR based on the known temporal position of the peak instant $T_P$. For example, the known temporal position of the peak instant $T_P$ is substantially at the end of the temporal range TR (1301), and the switching instant $T_S$ is selected at the end of temporal range TR (1301). At the switching instant $T_S$, the controller 312 controls the selector 332 to select the second reference signal REF2 as the input signal 338 to the clock generator 334.

Assume that frequencies of the reference signals REF1 and REF2 are 25 MHz and 24.875 MHz and that each period of the reference signals REF1 and REF2 is 40 ns and 40.2 ns, respectively. The reference signals REF1 and REF2 are synchronized every 8.04 μs. The spreading period $T_{SPD}$ is 30 μs and includes 750 clock cycles of the first reference signal REF1 and 746 clock cycles of the second reference signal REF2, respectively. The first and second reference signals REF1 and REF2 are synchronized four times (i.e., at synchronization times $T_N$) in each spreading period $T_{SPD}$. In some implementations, as the second reference signal REF2 varies between 24.875 MHz and 25 MHz, each spreading period $T_{SPD}$ includes four or less synchronization times $T_N$ (e.g., 2 or 3 synchronization times $T_N$ in FIG. 13).

The PFD 1302 of the controller 312 is configured to determine a frequency difference or a phase difference between the first and second reference signals REF1 and REF2. In some implementations, while the first reference signal REF1 is selected as the input signal 338, a feedback clock 710 (FBCK) has the same frequency (i.e., the first frequency which is substantially stable) as the first reference signal REF1. The PFD 1302 receives the feedback clock 710 (FBCK) and the second reference signal REF2, compares the feedback clock 710 (FBCK) and second reference signal REF2, and generates an UP signal and an DN signal. The UP signal indicates a rising edge of the feedback clock 710 (FBCK), and the DN signal indicates the phase difference between the second reference signal REF2 and the feedback clock 710 (FBCK). Alternatively, in some implementations, the PFD 1302 receives the first and second reference signal REF1 and REF2 and generates an UP signal and an DN signal. The UP signal indicates a rising edge of the first reference signal REF1, and the DN signal indicates the phase difference between the second reference signal REF2 and the first reference signal REF1.

The first and second reference signals REF1 and REF2 are synchronized at each synchronization time $T_N$ when the corresponding phase difference drops down to 0 (e.g., is less than a threshold phase difference). Prior to the next synchronization time $T_N$, the phase difference of the second reference signal REF2 and the first reference signal REF1 then increases from 0 to a peak shift. The UP signal has periodic short pulses indicating rising edges of the first reference signal REF1. The DN signal includes a plurality of successive trains of pulses 1304. A starting point and an end point of each train of pulses 1304 corresponds to two successive synchronization times $T_N$. During each train of pulses 1304, each pulse has a pulse width indicating the phase difference that varies with a temporal distance from a starting synchronization time $T_N$ associated with the starting point of the respective train of pulses 1304. In an example, the DN signal is enabled when the second reference signal REF2 is high and the first reference signal REF1 is low, such that the phase difference increases immediately after each synchronization time $T_N$.

For each train of pulses 1304, as pulses get closer to an end synchronization time $T_N$ associated with the end point of the train of pulses 1304, the corresponding pulse widths increase and pulse gaps decrease. The DN signal is modulated to generate a first range indicator signal 1306 enabled during a plurality of phase zero durations 1308. For example, each pulse of the plurality of successive trains of pulses 1304 is expanded by a predefined width, and a subset of each train of pulses 1304 including the end point of the respective train of pulses 1304 merge with each other to form a respective phase zero duration 1308 of the first range indicator signal 1306. Each phase zero duration 1308 is associated with an end point of a respective train of pulses 1304 of the DN signal and includes a respective synchronization time $T_N$ close to a falling edge of the phase zero duration 1308. The respective synchronization time $T_N$ is optionally at a rising edge, a falling edge, or within the temporal range TR that includes a peak frequency $f_P$, of the second reference signal REF2.

Figure 14A:
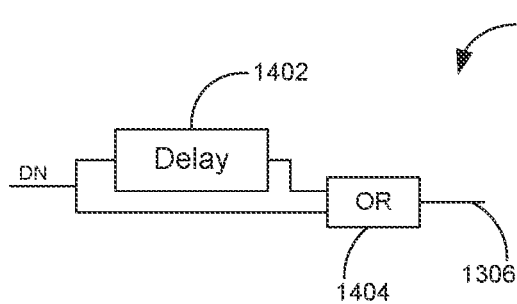
FIGS. 14A and 14B are schematic diagrams of two example pulse modulators, in accordance with some implementations.
Figure 14B:
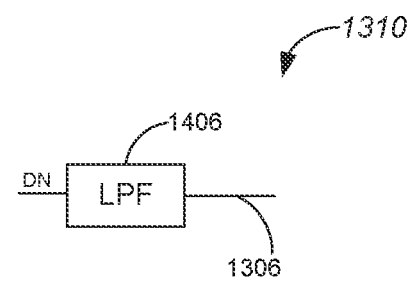

In some implementations, the controller 312 further includes a pulse modulator 1310 coupled to the PFD 1302 and configured to modulate the DN signal to generate the first range indicator signal 1306. FIGS. 14A and 14B are schematic diagrams of two example pulse modulators 1310, in accordance with some implementations. Referring to FIG. 14A, in some implementations, the pulse modulator 1310 includes at least one signal delay circuit 1402 and an OR logic 1404. The signal delay circuit 1402 is coupled to the PFD 1302 and configured to delay the DN signal (e.g., by 3 ns). The OR logic 1404 is coupled to both the PFD 1302 and the signal delay circuit 1402, and configured to combine the DN signal and the delayed DN signal to merge a subset of each train of pulses 1304 to generate a respective phase zero duration 1308 of the first range indicator signal 1306. Alternatively, in some implementations, referring to FIG. 14B, the controller 312 includes a low pass filter 1406 applied as a pulse modulator 1310 to modulate the DN signal. The low pass filter 1406 has a cutoff frequency fr, and a width of each phase zero duration 1308 of the first range indicator signal 1306 increases with a decrease of the cutoff frequency $f_P$. The cutoff frequency $f_P$ is set to form the respective phase zero duration 1308 of the first range indicator signal 1306.

Figure 15:
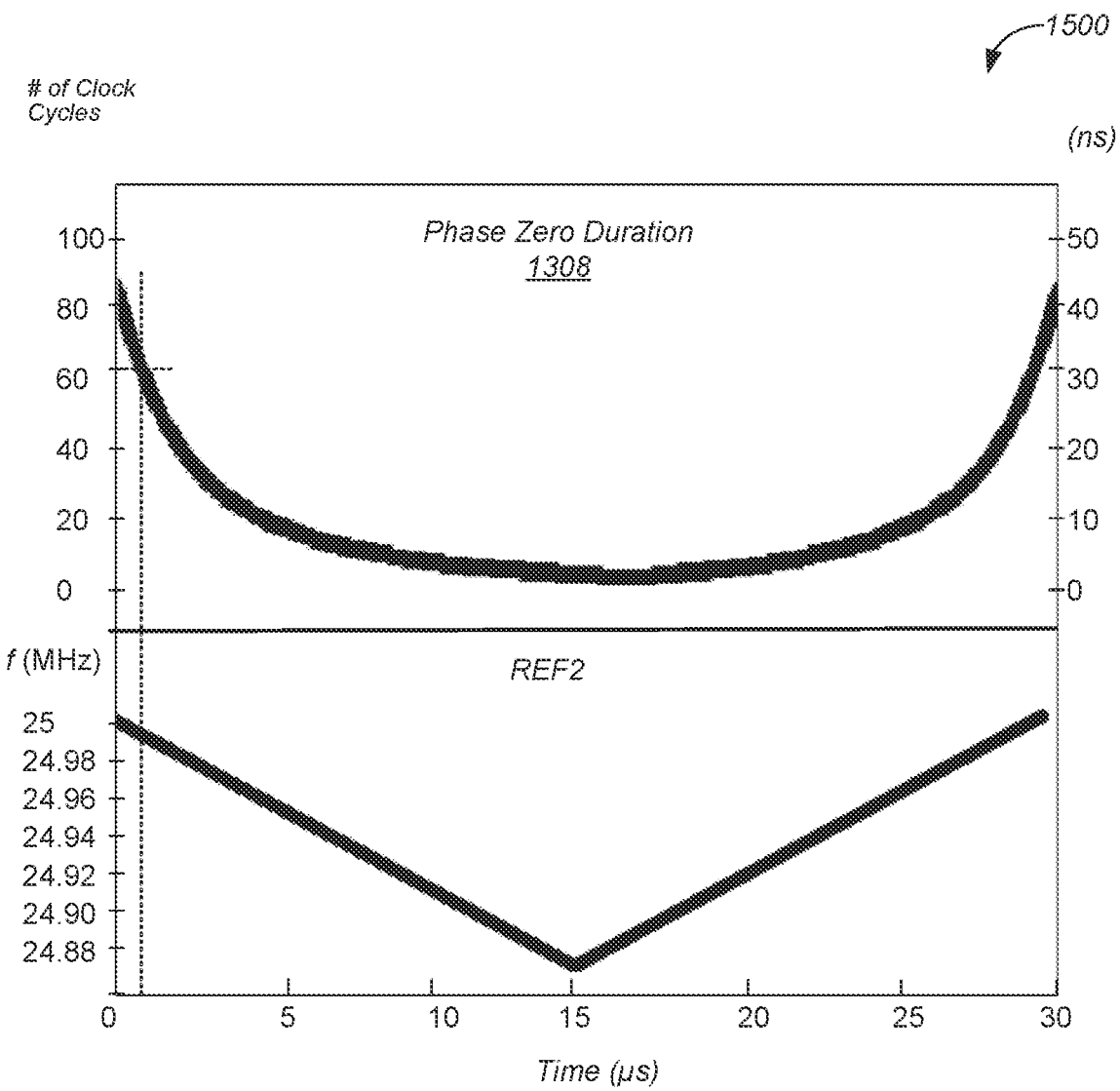
FIG. 15 illustrates temporal diagrams of a width of a phase zero duration and a second frequency of a second reference signal, in some implementations.

FIG. 15 illustrates temporal diagrams 1500 of a width of a phase zero duration 1308 and a second frequency of a second reference signal REF2, in some implementations. As explained above, the second frequency of the second reference signal REF2 varies with a spreading frequency $f_{SPD}$ corresponding to a spreading period $T_{SPD}$. Each phase zero duration 1308 has an average temporal location within a respective spreading period $T_{SPD}$. For each train of pulses 1304, how fast the corresponding pulse widths increase depends on a temporal location of the second frequency of the second reference signal REF2 at the respective spreading period $T_{SPD}$. As the corresponding second frequency of the second reference signal REF2 increases closer to the peak frequency $f_P$, the pulse widths of the corresponding train of pulses 1304 in the DN signal increase at a slower rate, resulting in a longer phase zero duration 1308. For example, the pulse modulator 1310 is applied to control the widths of the phase zero durations 1308 of the first range indicator signal 1306 to be less than 50 ns.

In some embodiments, when the second frequency of the second reference signal REF2 is close to 24.875 MHz, a phase zero duration 1308 includes 5 clock cycles of a over-sampling high frequency clock (e.g., 2 GHz). Conversely, when the second frequency of the second reference signal REF2 is equal to 24.99 MHz or above, a phase zero duration 1308 includes more than 60 clock cycles of the over-sampling high frequency clock (e.g., 2 GHz). A corresponding ratio of the numbers of clock cycle (i.e., which is equal to 60/6) is greater than 10, which is used to determine whether the second frequency of the second reference signal REF2 approaches or drifts away from the first frequency of the first reference signal REF1 (e.g., a feedback clock frequency). In an example, if the phase zero duration 1308 includes more than 80 clocks of the high frequency clock, the phase zero duration 1308 includes the peak instant TP. The known temporal position of the peak instant TP in the phase zero duration 1308 is determined based on the width of the phase zero duration 1308 (i.e., the clock cycle number measured in the phase zero duration 1308). In some situations, the periodic signal 336 is applied as the high frequency clock to count the width of the phase zero durations 1308 of the first range indicator signal 1306.

In some implementations, the controller 312 generates a first range indicator signal 1306 including a plurality of phase zero durations 1308 and select one of the plurality of phase zero durations 1308 as the temporal range TR (606) including a peak instant $T_P$ at which the second reference signal REF2 reaches a peak frequency $f_P$. Specifically, the controller 312 measures a width of each phase zero duration 1308. In accordance with a determination that a width of a first phase zero duration 1308 exceeds a width threshold $W_{TH}$ (e.g., a number of clock cycles exceeds a first clock number threshold), the controller 312 identifies the first phase zero duration 1308 as the temporal duration TR. Further, in some implementations, in accordance with a determination that the first phase zero duration 1308 is terminated, the controller 312 identifies the switching instant $T_S$ and controls the selector 332 to select the second reference signal REF2 as the input signal 338. The switching instant $T_S$, a rising edge of the first reference signal REF1, and a rising edge of the second reference signal REF2 are synchronized with each other. Additionally, in some implementations, in accordance with a determination that the width of the first phase zero duration 1308 exceeds a switching threshold $S_{TH}$ larger than the width threshold (e.g., the number of clock cycles exceeds a peak indicating number), the controller 312 identifies the switching instant $T_S$ and controls the selector 332 to select the second reference signal REF2 as the input signal 338. Stated another way, the first phase zero duration 1308 corresponds to the temporal range TR including the peak frequency $f_P$ of the second reference signal RFE2.

Alternatively and additionally, in some implementations, the known temporal position is within a last portion (e.g., last 5%) of the temporal range TR. From a start of the temporal range TR (i.e., the first phase zero duration 1308), the controller 312 increments a clock cycle number by 1 at each cycle of a high frequency clock (e.g., the first reference signal REF1). The switching instant $T_S$ is selected in response to the clock cycle number reaches a peak indicating number (e.g., corresponding to the switching threshold $S_{TH}$). The peak indicating number is associated with the known temporal position in the temporal range. e.g., indicating 90% of the first phase zero duration 1308 has been counted.

In some implementations, the controller 312 is configured to receive a system reset signal and select one of the first reference signal REF1 and REF2 at least partially based on the system reset signal. For example, the first reference signal REF1 is selected and drives the clock generator 334. The selector 332 is controlled by the controller 312 to select the second reference signal REF2 in place of the first reference signal REF1 at a switching instant $T_S$, in accordance with a determination that the system reset signal is disabled and a determination that the second reference signal REF2 is in the temporal range TR. Conversely, in some situations, the first reference signal REF2 is selected and drives the clock generator 334. Data are transmitted via the retimer 220 until the system reset signal is enabled. That said, the selector 332 is controlled by the controller 312 to, while the second reference signal REF2 is selected as the input signal 338, select the first reference signal REF1 in accordance with a determination that the system reset signal is enabled.

Referring to FIGS. 13-15, the input signal 338 of the clock generator 334 is switched from the first reference signal REF1 to the second reference signal REF2 smoothly when frequencies of the reference signals REF1 and REF2 are substantially close and phases of the reference signals REF1 and REF2 are synchronized. More importantly, based on the phase zero durations 1308, switching from the first reference signal REF1 to the second reference signal REF2 is controlled entirely using digital circuit (e.g., PFD 1302, delay circuit 1402, OR logic 1404, filter 1406, and counters), which largely simplifies design, implementation, and modification of the controller.

Figure 16:
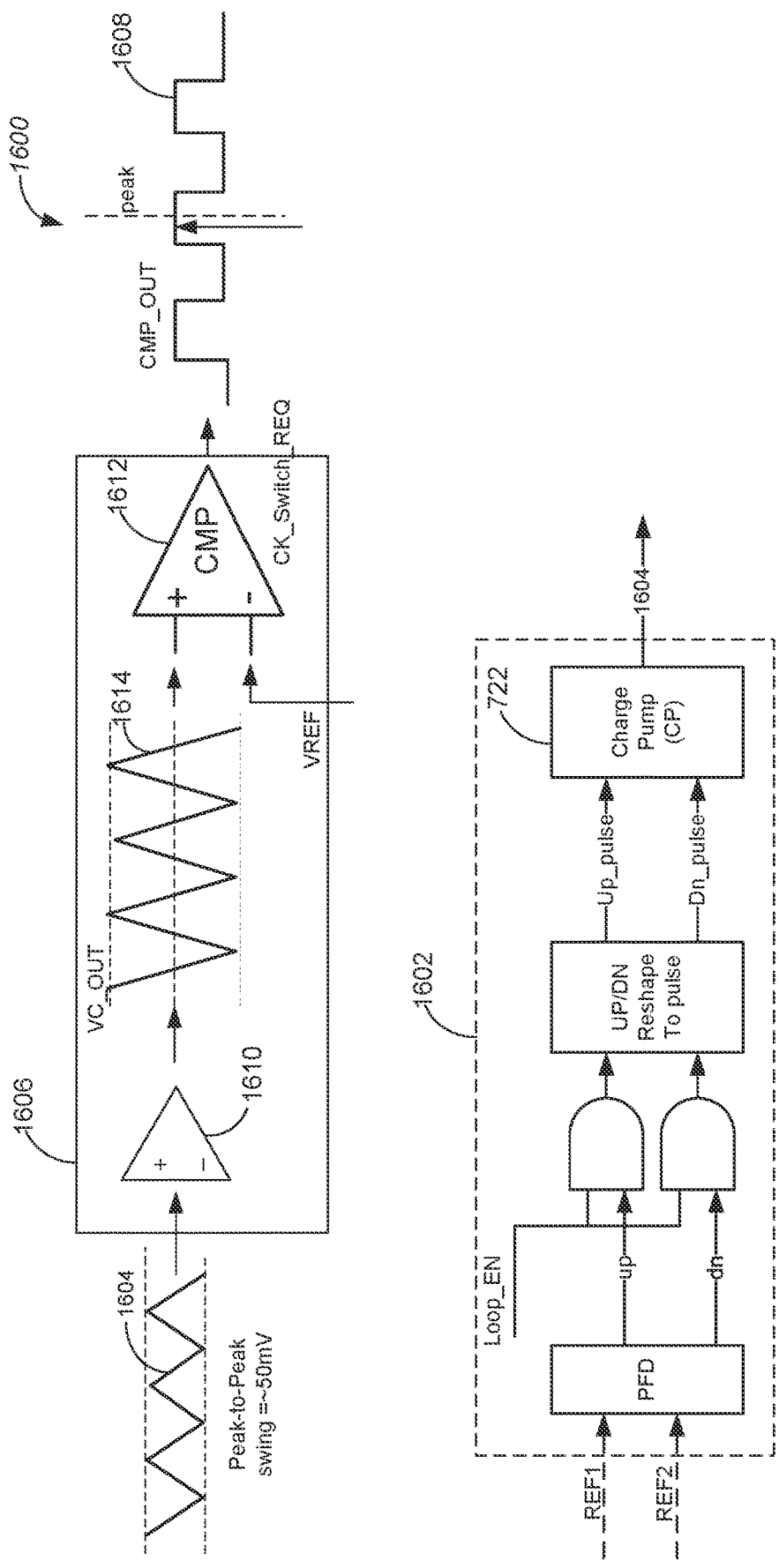
FIG. 16 is a block diagram of an example electronic system for determining a temporal range in which reference signals are switched, in accordance with some implementations.

FIG. 16 is a block diagram of an example electronic system 1600 for determining a temporal range TR in which reference signals REF1 and REF2 are switched, in accordance with some implementations. The temporal range TR includes a peak instant $T_P$ at which a second reference signal REF2 reaches a peak frequency (e.g., 25 MHz). The first reference signal REF1 remains substantially stable at the peak frequency, while the second reference signal REF2 varies between the peak frequency $f_P$ and a down-spreading frequency 602 within with a spreading frequency $f_{SPD}$ corresponding to a spreading period $T_{SPD}$. A frequency or phase comparator 1602 generates a difference signal 1604 having a temporal voltage level that indicates a frequency mismatch between the first and second reference signals REF1 and REF2. The difference signal 1604 is optionally filtered by a low pass filter. A signal conditioning circuit 1606 is coupled to the comparator 1602, and configured to receive the difference signal 1604 and generate a second range indicator signal 1608 enabled during the temporal range TR, thereby indicating the temporal range TR. A temporal width of the temporal range TR is linearly related to a duty cycle of the second range indicator signal 1608.

In some implementations, the frequency or phase comparator 1602 receives the first and second reference signals REF1 and REF2. In some implementations, the frequency or phase comparator 1602 receives the second reference signal REF2 and a feedback clock 710 generated by the PLL 700 when the PLL 700 is driven by the first reference signal REF1. In an example, the difference signal 1604 varies between a peak voltage and a valley voltage with the spreading frequency $f_{SPD}$, and has a peak-to-peak swing of 50 mV, and each peak voltage of the difference signal 1604 is measured substantially at a respective peak instant $T_P$ at which the second reference signal REF2 reaches the peak frequency $f_P$.

In some implementations, the signal conditioning circuit 1606 further includes an amplifier 1610 and an output comparator 1612. The amplifier 1610 amplifies a difference amplitude (i.e., the peak-to-peak swing of 50 mV) of the difference signal 1604 to generate an amplified difference signal 1614 having a first amplitude voltage (e.g., 1V). A DC reference voltage VREF is selected (e.g., in a dynamic range of the amplified difference signal 1614). The output comparator 1612 compares the amplified difference signal 1614 with the DC reference voltage VREF to generate the second range indicator signal 1608. The duty cycle of the second range indicator signal 1608 decreases linearly with an increase of a magnitude of the DC reference voltage VREF. In an example, the DC reference voltage VREF is in the middle of the first amplitude voltage (i.e., dynamic range of the amplified difference signal 1614), and the duty cycle of the second range indicator signal 1608 is 50%. In some situations, a median level of the difference signal 1604 is the same as a median level of the amplified difference signal 1614, and equal to the DC reference voltage VREF. The duty cycle and the temporal width of the temporal range TR are equal to 50% of a period of the difference signal 1604. The period of the difference signal 1604 is equal to the spreading period $T_{SPD}$ corresponding to the spreading frequency $f_{SPD}$. In another example, the DC reference voltage VREF is above the middle of the first amplitude voltage. The duty cycle of the second range indicator signal 1608 is less than 50%, and the temporal width of the temporal range TR are less than 50% of the period of the difference signal 1604.

In some implementations, the same DC reference voltage VREF is applied to generate the second range indicator signal 1608 for both rising and falling sides of the amplified difference signal 1614. The peak instant $T_P$ is located in the middle of each pulse of the second range indicator signal 1608, and the duty cycle is symmetric with respect to the peak instant $T_N$. Alternatively, in some implementations, two distinct DC reference voltages VREF1 and VREF2 are applied to generate the second range indicator signal 1608 for the rising and falling sides of the amplified difference signal 1614, respectively. The peak instant $T_P$ is not located in the middle of each pulse of the second range indicator signal 1608, and the duty cycle is asymmetric with respect to the peak instant $T_P$ based on the levels of the DC reference voltages VREF1 and VREF2.

In some implementations, the temporal range TR of the second range indicator signal 1608 is measured to have a total clock cycle number (e.g., using a high reference clock signal or a periodic signal 336). The known temporal position of the peak frequency $f_P$ of the second reference signal REF2 corresponds to a peak indicating number (e.g., equal to a half of the total clock cycle number). From a start of the temporal range TR, the controller 312 increments a clock cycle number by 1 at each cycle of a high frequency clock. The switching instant $T_S$ is selected in response to the clock cycle number reaches the peak indicating number associated with the known temporal position in the temporal range TR.

Figure 17:
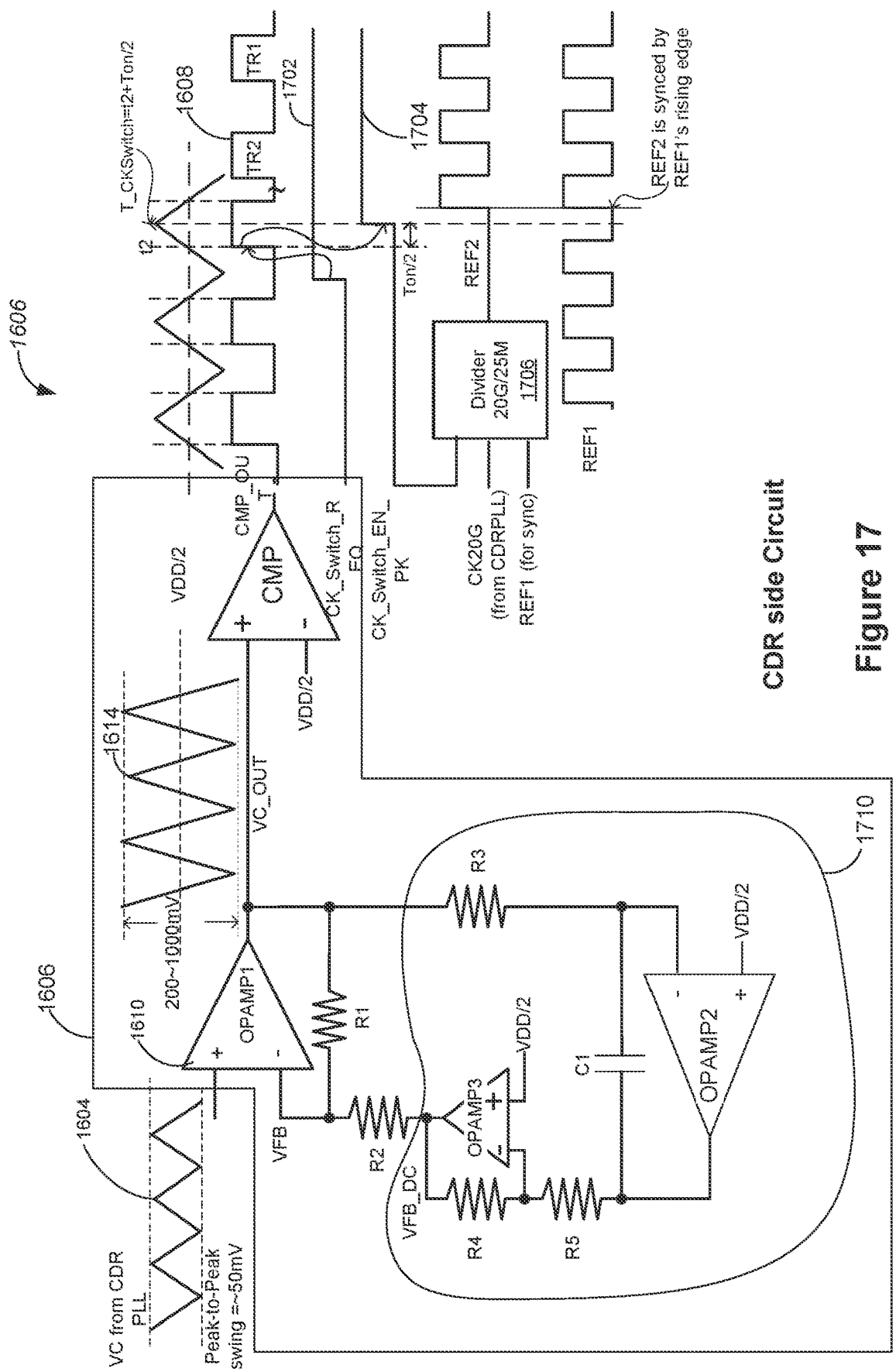
FIG. 17 is a block diagram of another example signal conditioning circuit for determining a temporal range having a peak instant when two reference signals are switched, in accordance with some implementations.

FIG. 17 is a block diagram of another example signal conditioning circuit 1606 for determining a temporal range having a peak instant $T_P$ when the reference signals REF1 and REF2 are switched, in accordance with some implementations. A difference signal 1604 has a temporal voltage level that varies with a frequency mismatch between the first and second reference signals REF1 and REF2. The signal conditioning circuit 1606 is configured to receive the difference signal 1604 and generate a second range indicator signal 1608 enabled during the temporal range TR, thereby indicating the temporal range TR. A temporal width of the temporal range TR is linearly related to a duty cycle of the second range indicator signal 1608. As explained above, in some implementations, the signal conditioning circuit 1606 further includes an amplifier 1610 and an output comparator 1612. An integrator feedback 1710 and two resistors (R1 and R2) are applied to couple an output of the amplifier 1610 to a negative input node of the amplifier 1610, such that the amplifier 1610 amplifies a difference amplitude (i.e., having a peak-to-peak swing of 50 mV) of the difference signal 1604 to generate an amplified difference signal 1614 having a DC common mode voltage VCM and a first amplitude voltage (e.g., 0.2-1V). A DC reference voltage VREF is selected in a dynamic range of the amplified difference signal 1614. The output comparator 1612 compares the amplified difference signal 1614 with the DC reference voltage VREF to generate the second range indicator signal 1608.

In an example, both the DC common mode voltage VCM of the amplified difference signal 1614 and the DC reference voltage VREF is set at a middle point of a high power supply voltage and a low power supply voltage, e.g., which is equal to VDD/2 where VDD is the high power supply voltage. For the amplifier 1610, R4 is equal to R5, and an amplifier OPAMP3 has a unity gain and acts as an inverter. DC levels of a voltage signal VFB and the amplified difference signal 1614 are equal to a DC level of the difference signal 1604 and VD/2, respectively. In some situations, a ratio R1/R2 is in a range of 4-40. A swing of the amplified difference signal 1614 is 0.2-1V. A resistor R3 has a resistance of 100 Mohm, and a capacitor C2 has a capacitance of 20 pF. As such, the integrator feedback 1710 coupled to the amplifier 1610 has a filter bandwidth of 0.08 kHz.

In some implementations, a first frequency switching enable signal 1702 is applied to control switching of the first reference signal REF1 to the second reference signal REF2. While the first reference signal REF1 is selected and drives the PLL 700, in accordance with a determination that the first frequency switching enable signal 1702 is disabled, the controller 312 does not identify the temporal range TR, select a switching instant $T_S$, or control the selector 332 to select the second reference signal REF2 as the input signal 338 (FIG. 3B). Conversely, while the first reference signal REF1 is selected and drives the PLL 700, in accordance with a determination that the first frequency switching enable signal 1702 is enabled, the controller 312 identifies the temporal ranges TR including a peak instant $T_P$ at which the second reference signal REF2 reaches a peak frequency $f_P$, select a switching instant $T_S$ in the temporal range TR, or control the selector to select the second reference signal REF2 as the input signal 338 at the switching instant $T_S$.

The divider 1706 is configured to generate the second reference signal REF2 from a high frequency clock (e.g., having a frequency of 20 GHz), while using the first reference signal RFE1 as a reference. The second reference signal REF2 has the same frequency and phase as the first frequency signal REF1. When the second reference signal REF2 is selected to replace the first reference signal REF1 in the clock control circuit 330 (FIG. 3), little frequency or phase jump occurs to the input signal 338 to drive the clock generator 334, and little or no spurs are introduced in the periodic signal 336 generated by the clock generator 334.

In some embodiments, a high frequency clock (e.g., having a frequency of 20 GHz) is applied to determine a width of a temporal range TR and a switching point (e.g., a middle of the width of the temporal range TR). Specifically, in some implementations, from a start of a first temporal range TR1, the controller 312 increments a clock cycle number by 1 at each cycle of the high frequency clock (e.g., having a frequency of 20 GHz). The switching instant $T_S$ is selected in response to the clock cycle number reaches a peak indicating number (e.g., 1000). The peak indicating number is associated with the known temporal position in the first temporal range TR1, e.g., a middle point of the first temporal range TR1. Further, in some implementations, a second temporal range TR2 precedes the first temporal range TR1 and includes a second peak instant T at which the second reference signal REF2 reaches the peak frequency. While the first reference signal REF1 has been selected as the input signal 338 to drive the clock generator 334 before the second temporal range, the controller 312 count a second clock cycle number from 1 according to the high frequency clock from a start of the second temporal range TR2. The counter 312 determines that the second temporal range TR2 corresponds to a total clock cycle number (e.g., 2000). Based on the known temporal position, the controller 312 determines the peak indicating number, e.g., as a half of the total clock cycle number.

After reaching the peak indicating number, the controller 312 identifies a rising edge of the first reference signal REF1 that immediately follows the peak instant $T_P$. A second frequency switching enable signal 1704 is generated to be synchronized with the rising edge of the first reference signal REF1. In accordance with a determination that the second frequency switching enable signal 1704 is enabled, the second reference signal REF2 is selected as the input signal 338 to drive the clock generator 334 (e.g., PLL 700). The second reference signal REF2 is synchronized with the first reference signal REF2 and the second frequency switching enable signal 1704. It is noted that the second frequency switching enable signal 1704 is generated in accordance with a determination that the first frequency switching enable signal 1702 is enabled.

Figure 18:
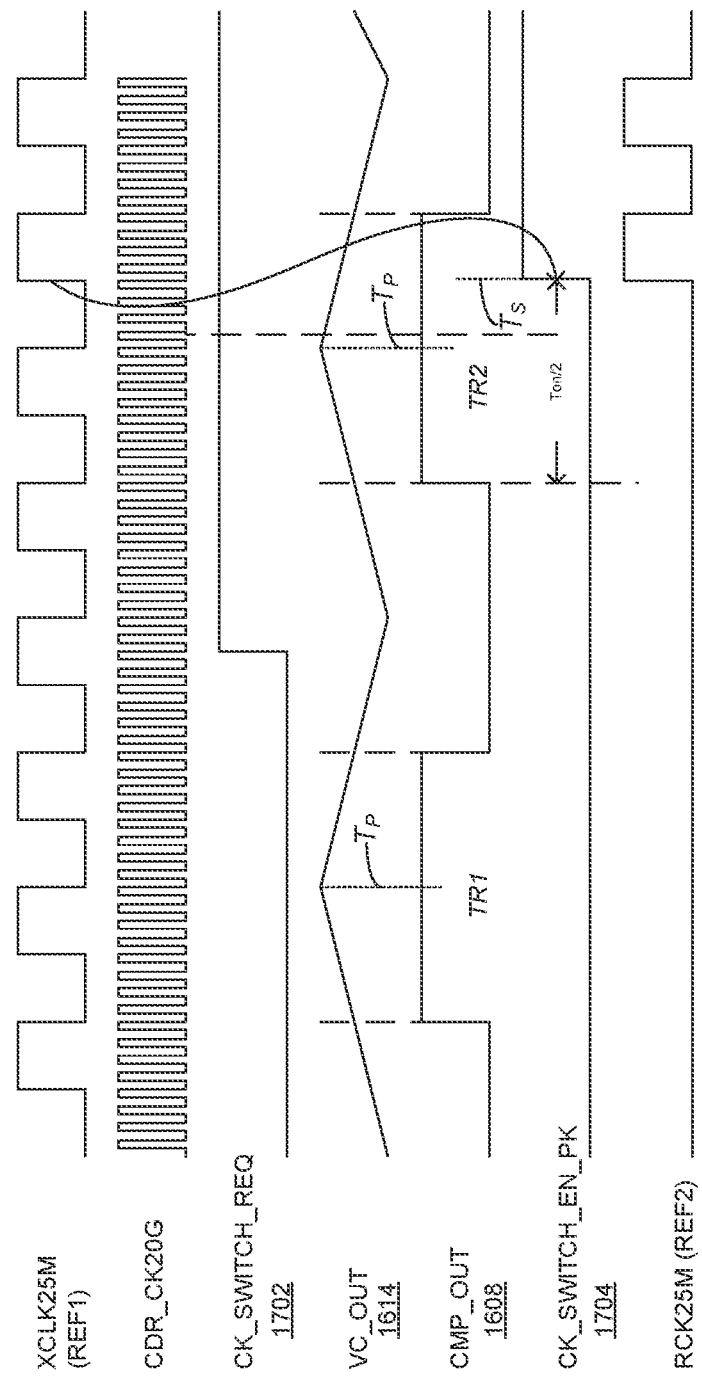
FIG. 18 is a temporal diagram of a plurality of signals applied to switch reference signals of a clock generator, in accordance with some implementations.

FIG. 18 is a temporal diagram of a plurality of signals 1800 applied to switch reference signals of a clock generator 334 (e.g., a PLL 700), in accordance with some implementations. In some implementations, the PLL 700 is applied at a transmission side of an electronic device 104 coupled to a data link 120 or a transmission side of a retimer 220 of a data link 120. In some implementations, the first and second reference signals REF1 and REF2 coupled to the selector 332 are transferred with route paths that are substantially identical and processed with two buffer sets that are substantially identical. By these means, when the first reference signal REF1 is switched to the second reference signal REF2 to drive the PLL 700 during a temporal range TR, a difference of frequencies of the first and second reference signals REF1 and REF2 is minimized (e.g., controlled below a frequency difference tolerance).

The selector 332 selects the first reference signal REF1 as an input signal 338 having an input phase. The clock generator 334 receives the input signal 338 from the selector 332 and generates a periodic signal 336 with reference to the input signal 338. The periodic signal 336 has an output phase that matches the input phase of the input signal 338. While the first reference signal REF1 is selected as the input signal 338, a controller 312 identifies a temporal range TR (e.g., TR1, TR2) including a peak instant $T_P$ at which the second reference signal REF2 reaches a peak frequency $f_P$. The peak instant T has a known temporal position with respect to the temporal range TR. In some implementations, an amplified difference signal 1614 is generated to amplify a difference signal 1604 indicating a difference of frequencies of the reference signals REF1 and REF2. The amplified difference signal 1614 is compared with one or more DC reference voltage (e.g., VREF, VREF1, VREF2 in FIG. 16) to digitize the amplified difference signal 1614 to the second range indicator signal 1608. In an example, the peak instant $T_P$ is located in the middle of the temporal range TR. In some implementations, a high frequency clock (e.g., having a frequency of 20 GHz) is applied to measure a total clock cycle number of the temporal range TR. The peak instant $T_P$ is identified by counting a half of the total clock cycle number from a start of the temporal range TR.

A switching instant $T_S$ follows the peak instant $T_P$ within the temporal range TR based on the known temporal position. Particularly, a second frequency switching enable signal 1704 is synchronized to the first reference signal REF1, and enabled to control the selector 332 to select the second reference signal REF2 as the input signal 338. A rising edge of the second frequency switching enable signal 1704 is aligned with the first rising edge of the first reference signal REF1 immediately after the peak instant $T_P$. The rising edge of the second frequency switching enable signal 1704 is synchronized with a rising edge of the second reference signal REF2, and controls selection of the second reference signal REF2 in place of the first reference signal REF1. By these means, the input signal 338 of the clock generator 334 (FIG. 3B) is switched from the first reference signal REF1 to the second reference signal REF2 smoothly when frequencies of the reference signals REF1 and REF2 are substantially close and phases of the reference signals REF1 and REF2 are synchronized, thereby allowing an overshoot on an output frequency of the periodic signal 336 to be suppressed below a predefined portion of the periodic frequency of the periodic signal.

In some implementations, a first frequency switching enable signal 1702 is enabled to control the selector 332 to select the second reference signal REF2 as the input signal 338. In accordance with a determination that the first frequency switching enable signal 1702 is enabled, the temporal range TR including the peak instant $T_P$ is identified, and the second reference signal REF2 is enabled to select the switching instant in the temporal range TR for selecting the second reference signal REF2. Stated another way, the second frequency switching enable signal 1704 is enabled to select the second reference signal REF2 in place of the first reference signal REF1, in accordance with a determination that the first frequency switching enable signal 1702 is enabled.

Figure 19A:
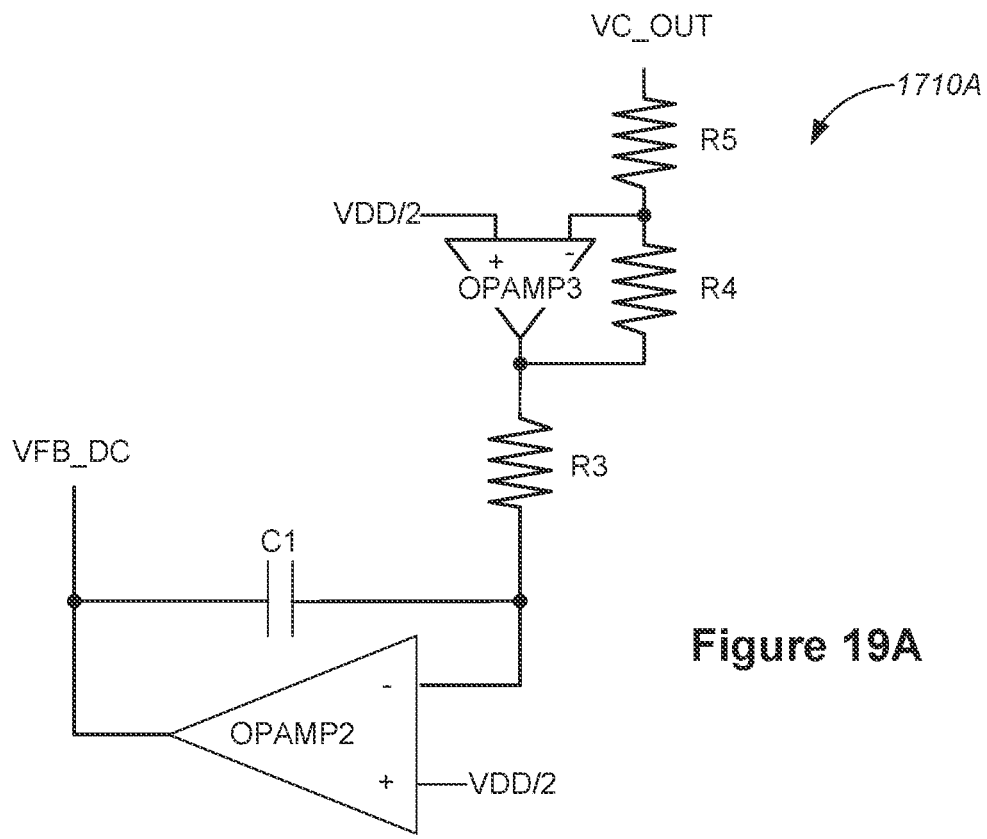
FIGS. 19A and 19B are schematic diagrams of two example integrator feedbacks, in accordance with some implementations.
Figure 19B:
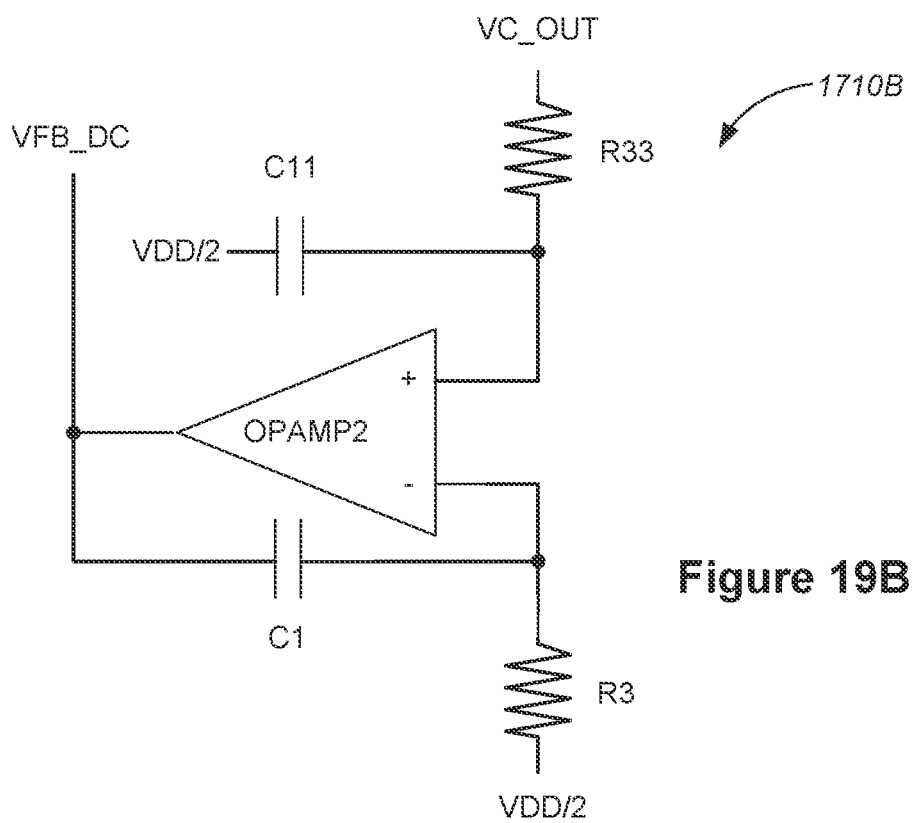

FIGS. 19A and 19B are schematic diagrams of two example integrator feedbacks 1710A and 1710B, in accordance with some implementations. An amplifier 1610 is applied to amplify a difference signal 1604 to an amplified difference signal 1614 having a DC common mode voltage (e.g., equal to VDD/2). An integrator feedback 1710A or 1710B is coupled to the amplifier 1610 jointly with two resistors R1 and R2. A first resistor R1 is coupled to an output VC_OUT and a negative input node VFB of the amplifier 1610, and a second resistor R2 is coupled to the negative input node VFB of the amplifier 1610 and an intermediate node VFB_DC. The integrator feedback 1710A or 1710B is coupled to the output VC_OUT (1614) and the intermediate node VFB_DC. The integrator feedback 1710A or 1710B receives an input of the DC common mode voltage (e.g., equal to VDD/2) and provides a feedback path between the output VC_OUT and negative input node VFB of the amplifier 1610 with the resistors R1 and R2 based on the DC common mode voltage. Referring to FIG. 19A, in some implementations, the integrator feedback 1710A includes two operational amplifiers OPAMP2 and OPAMP3.

Referring to FIG. 19B, in some implementations, the integrator feedback 1710B includes one operational amplifier OPAMP2.

Figure 20:
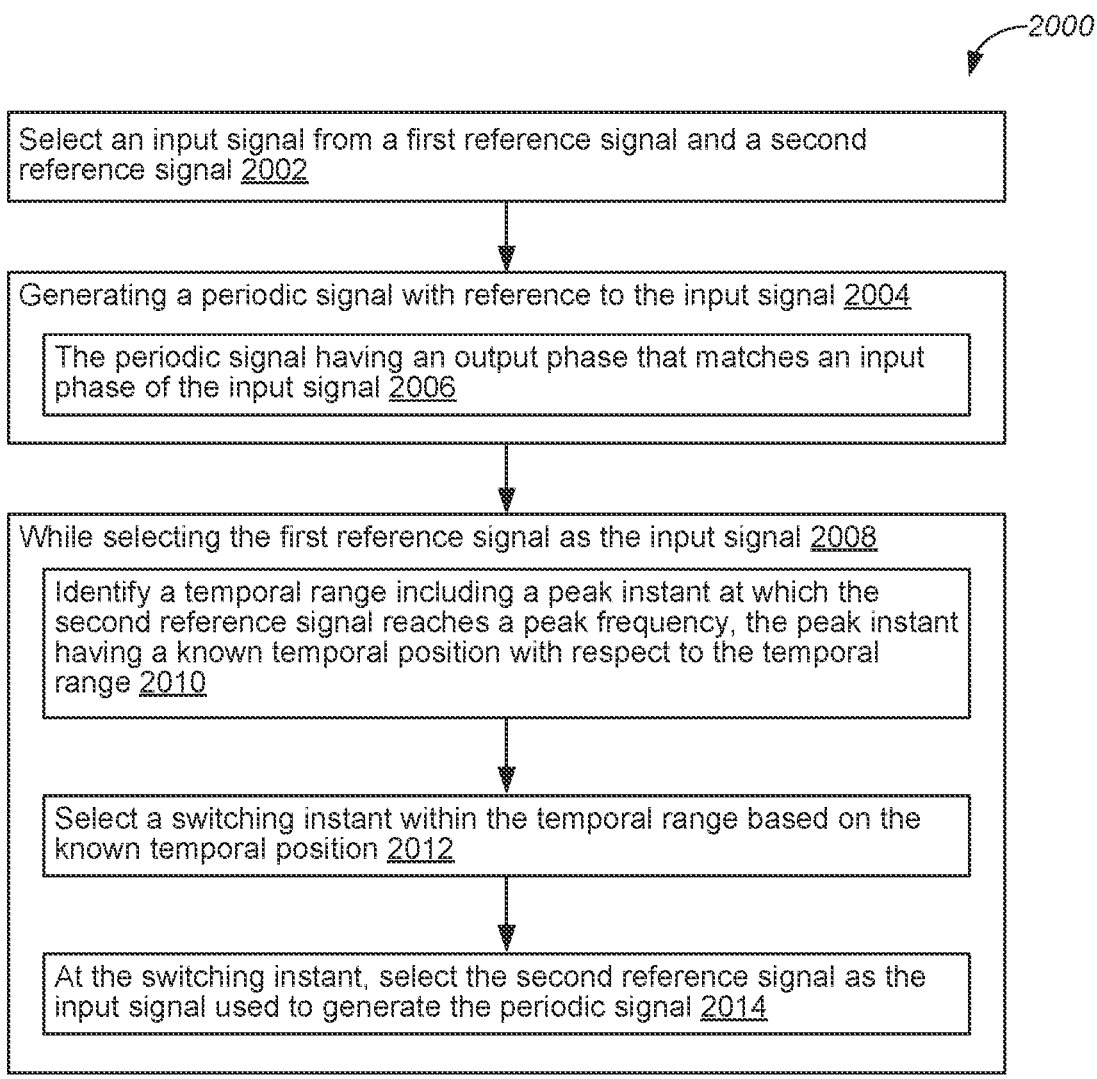
FIG. 20 is a flow diagram of an example method of controlling frequency in an electronic device (e.g., a data link, a data interface), in accordance with some implementations.

FIG. 20 is a flow diagram of an example method 2000 of controlling frequency in an electronic device (e.g., a data link, a data interface), in accordance with some implementations. The electronic device includes a retimer 220. The electronic device selects (2002) an input signal 338 from a first reference signal REF1 and a second reference signal REF2 (e.g., via a selector 332) and generates (2004) a periodic signal 336 with reference to the input signal 338. The periodic signal 336 has (2006) an output phase that matches an input phase of the input signal 338. While the first reference signal REF1 is (2008) selected as the input signal 338, the electronic device identifies (2010) a temporal range TR including a peak instant $T_P$ at which the second reference signal REF2 reaches a peak frequency. The peak instant $T_P$ has a known temporal position with respect to the temporal range TR. The electronic device selects (2012) a switching instant $T_S$ within the temporal range TR based on the known temporal position and selects (2014) the second reference signal REF2 as the input signal 338 used to generate the periodic signal 336 at the switching instant $T_P$. In some situations, the switching instant $T_S$ is on a frequency rising edge of the second reference frequency REF2.

In some implementations, the controller 312 further includes a phase frequency detector 1302 and a pulse modulator 1310. The phase frequency detector 1302 receives the first and second reference signals REF1 and REF2 and generates a difference indicator signal (e.g., the DN signal in FIG. 13) indicating a phase difference between phases of the first and second reference signals REF1 and REF2. The pulse modulator 1310 is coupled to the phase frequency detector 1302. The pulse modulator 1310 modulates the difference indicator signal and generates a first range indicator signal 1306 enabled during a plurality of pulse zero durations 1308. The temporal range TR is identified in the plurality of pulse zero durations 1308 based on a width of each pulse zero duration 1308. Further, in some implementations, the pulse modulator 1310 includes a low pass filter having a cutoff frequency, and the width of each pulse zero duration 1308 of the first range indicator signal 1306 increases with a decrease of the cutoff frequency. In some implementations, the controller 312 identifies one of the plurality of pulse zero durations 1308 of the first range indicator signal 1306 as the temporal range TR. From a start of the temporal range TR identified in the first range indicator signal 1306, the controller 312 increments a clock cycle number by 1 at each cycle of a high frequency clock. The switching instant $T_S$ is selected in response to the clock cycle number reaching a peak indicating number associated with the known temporal position in the temporal range TR (e.g., 90% of the total clock cycle number being counted). In some implementations, the pulse modulator 1310 further includes at least one signal delay circuit 1402 and an OR logic 1404 coupled to the at least one signal delay circuit 1402. The at least one signal delay circuit 1402 delays the difference indicator signal by a delay to generate a delayed indicator signal, and the OR logic 1404 combines the difference indicator signal and the delayed indicator signal to merge a plurality of pulses of the difference indicator signal and generate each phase zero pulse 1308 of the first range indicator signal 1306.

In some implementations, the controller 312 further includes a comparator 1602 and a signal conditioning circuit 1606. The comparator 1602 generates a difference signal having a temporal voltage level that indicates a frequency mismatch between the first and second reference signals REF1 and REF2. The signal conditioning circuit 1606 receives the difference signal 1604 and generates a second range indicator signal 1608 enabled during the temporal range TR, thereby indicating a temporal width of the temporal range TR linearly related to a duty cycle of the second range indicator signal 1608. Additionally, in some implementations, the signal conditioning circuit 1606 generates the second range indicator signal 1608 by amplifying a difference amplitude of the difference signal 1604 to generate an amplified difference signal 614 having a first amplitude voltage, selecting a DC reference voltage (e.g., in a dynamic range of the difference signal 1604), and comparing the amplified difference signal 614 with the DC reference voltage to generate the second range indicator signal 1608. The duty cycle of the second range indicator signal 1608 decreases linearly with an increase of a magnitude of the DC reference voltage VREF (FIG. 16). In an example, the duty cycle is symmetric with respect to the peak instant $T_P$. Additionally, in some situations, the signal conditioning circuit 1606 generates the second range indicator signal 1608 by shifting a median level of the difference signal 1604 to the DC reference voltage. The duty cycle and the temporal width of the temporal range TR is equal to 50% of a period of the difference signal 1604, and the period of the difference signal 1604 is equal to a period of the periodic signal 336.

In some implementations, the controller 312 determines that the temporal range TR corresponds to a total clock cycle number and the known temporal position corresponds to a half of the total clock cycle number. From a start of the temporal range TR, the controller 312 increments a clock cycle number by 1 at each cycle of a high frequency clock. The switching instant $T_S$ is selected in response to the clock cycle number reaching a peak indicating number, and the peak indicating number is associated with the known temporal position in the temporal range TR.

In some implementations, the clock generator 334 further includes a voltage controlled oscillator (VCO) 706. The VCO 706 is driven by a difference signal 714 and generates the periodic signal 336 based on the difference signal 714. The difference signal 714 has a temporal voltage level that corresponds to a frequency mismatch between the input signal 338 and a feedback clock 710 generated from the periodic signal 336. The periodic signal 336 has an output frequency that varies with the temporal voltage level.

Further, in some implementations, the clock generator 334 further includes a phase lock loop (PLL) 700. The PLL 700 further includes a PLL frequency or phase comparator 702 configured to receive the input signal 338 and the feedback clock and generate a PLL comparison signal 712, a loop filter 704 coupled to the PLL frequency or phase comparator 702 and configured to generate the difference signal 714 based on the PLL comparison signal 712, the voltage controlled oscillator (VCO) 706 coupled to the loop filter 704, and a feedback path 708 coupled to the VCO 706 and PLL frequency or phase comparator 702. The feedback path 708 is configured to convert the periodic signal 336 to the feedback clock 710 and feed the feedback block 708 to the PLL frequency or phase comparator 702. Additionally, in some implementations, the PLL 700 further includes providing the charge pump circuit 722 coupled to the loop filter 704. The charge pump 722 controls a variation rate of the difference signal 714, such that in response to the input signal 338 being switched from the first reference signal REF1 to the second reference signal REF2, an overshoot on an output frequency of the periodic signal 336 is less than a predefined portion of the periodic frequency.

In some implementations, from a start of the temporal range TR, the controller 312 increments a clock cycle number by 1 at each cycle a high frequency clock. The switching instant $T_S$ is selected in response to the clock cycle number reaches a peak indicating number, and the peak indicating number is associated with the known temporal position in the temporal range TR. Additionally, in some implementations, the temporal range TR is a first temporal range TR1, and the second temporal range TR2 precedes the first temporal range TR1 and includes a second peak instant $T_P$ at which the second reference signal REF2 reaches the peak frequency. While the first reference signal REF1 has been selected as the input signal 338 before a second temporal range TR2, the controller 312 counts a second clock cycle number from 1 from a start of the second temporal range TR2 according to the high frequency clock, determines that the second temporal range TR2 corresponds to a total clock cycle number, and based on the known temporal position, determines the peak indicating number.

In some implementations, a frequency of the second reference signal REF2 is rising towards the peak frequency during the temporal range TR, and the selector 332 is controlled by the controller 312 to select the second reference signal REF2 in place of the first reference signal REF1 when the frequency of the second reference signal REF2 is rising towards the peak frequency in the temporal range TR.

In some implementations, the controller 312 receive a system reset signal and, while the first reference signal REF1 is selected as the input signal 338, determines whether the system reset signal is enabled. The selector 332 is controlled by the controller 312 to select the second reference signal REF2 in place of the first reference signal REF1 at the switching instant $T_S$ in accordance with a determination that the system reset signal is enabled.

In some implementations, a data link has a retimer, and the retimer includes a transmitter portion, a receiver portion, the selector 332, the clock generator 334, and the controller 312. The electronic device operates at a training mode and a data transmission mode, reconfigures the receiver portion based on the periodic signal 336 that is generated from the first reference signal REF1 during the training mode, and communicates data in synchronization with the periodic signal 336 that is generated from the second reference signal REF2 during the data transmission mode.

In some implementations, the switching instant $T_S$, a rising edge of the first reference signal REF1, and a rising edge of the second reference signal REF2 are synchronized with each other.

Figure 21:
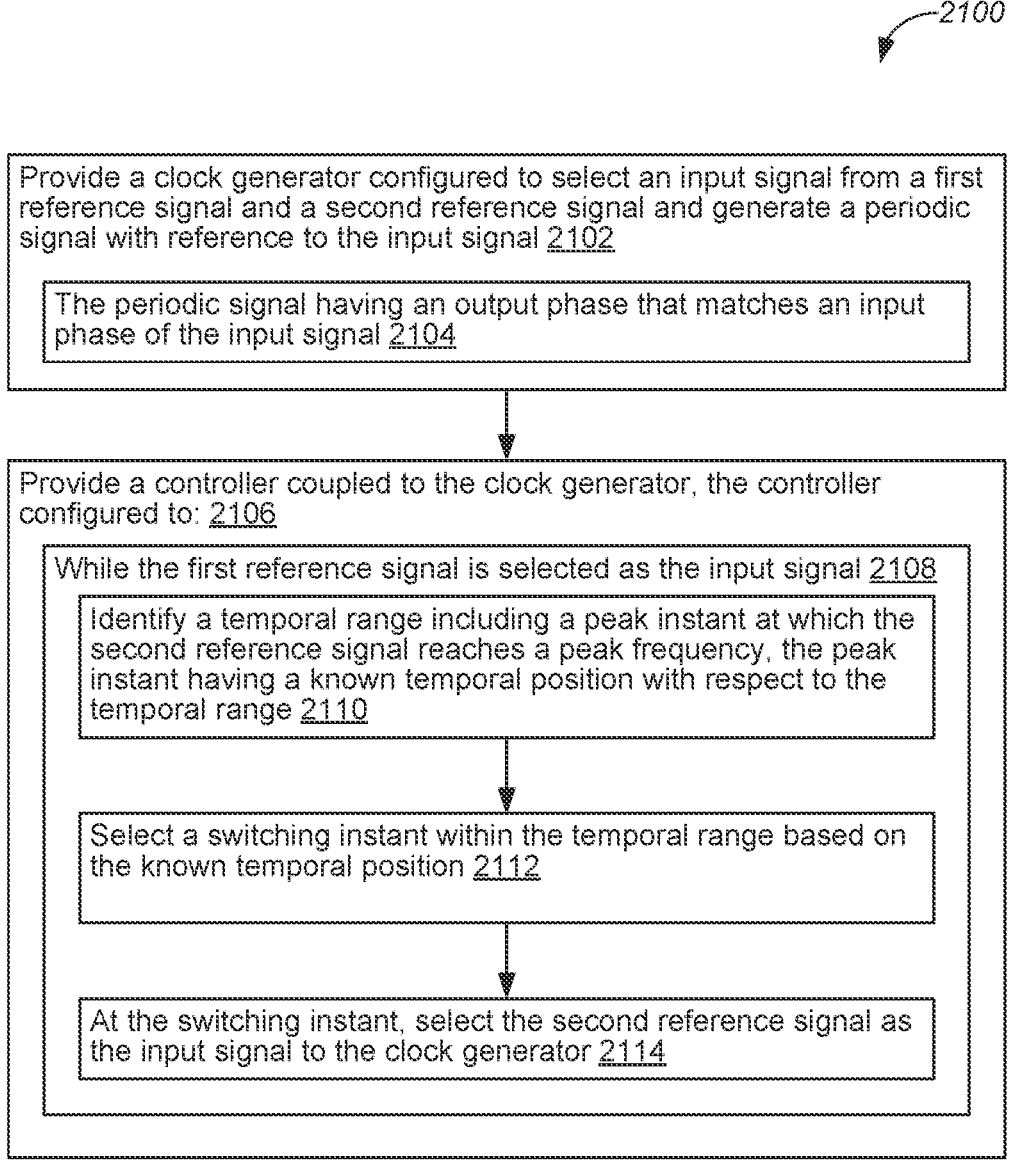
FIG. 21 is a flow diagram of an example method of providing an electronic device (e.g., a data link, a data interface) for frequency controlling, in accordance with some implementations.

FIG. 21 is a flow diagram of an example method 2100 of providing an electronic device (e.g., a data link, a data interface) for frequency controlling, in accordance with some implementations. The electronic device includes a retimer 220. A clock generator 334 is provided (2102) and configured to select an input signal 338 from a first reference signal REF1 and a second reference signal REF2 (e.g., via a selector 332) and generate a periodic signal 336 with reference to the input signal 338. The periodic signal 336 has (2104) an output phase that matches an input phase of the input signal 338. A controller 312 (e.g., clock switch state machine) is provided (2106) and coupled to the clock generator 334. The controller 312 configured to, while the first reference signal REF1 is selected as the input signal 338 (2108), identify (2110) a temporal range TR including a peak instant $T_P$ at which the second reference signal REF2 reaches a peak frequency, select (2112) a switching instant $T_S$ within the temporal range TR based on a known temporal position of the peak instant $T_P$ with respect to the temporal range TR, and at the switching instant $T_S$, select (2114) the second reference signal REF2 as the input signal 338 to the clock generator 334. In some situations, the switching instant $T_S$ is on a frequency rising edge of the second reference frequency REF2.

In some implementations, providing the controller 312 includes providing a phase frequency detector 1302 and providing a pulse modulator 1310. The phase frequency detector 1302 is configured to receive the first and second reference signals and generate a difference indicator signal indicating a phase difference between phases of the first and second reference signals. The pulse modulator 1310 is coupled to the phase frequency detector 1302 and configured to modulate the difference indicator signal and generate a first range indicator signal 1306 enabled during a plurality of pulse zero durations 1308, wherein the temporal range TR is identified in the plurality of pulse zero durations 1308 based on a width of each pulse zero duration. Further, in some implementations, the pulse modulator 1310 is provided with a low pass filter having a cutoff frequency, and the width of each pulse zero duration 1308 of the first range indicator signal 1306 increases with a decrease of the cutoff frequency. Additionally, in some implementations, the controller 312 is configured to identify one of the plurality of pulse zero durations 1308 of the first range indicator signal 1306 as the temporal range TR. The known temporal position is within a last known portion of temporal range TR, e.g., last 5% of the temporal range TR. The controller 312 is configured to from a start of the temporal range TR identified in the first range indicator signal 1306, increment a clock cycle number by 1 at each cycle of a high frequency clock. The switching instant $T_S$ is selected in response to the clock cycle number reaching a peak indicating number. The peak indicating number is associated with the known temporal position with respect to the temporal range TR, e.g., when 90% of the total clock cycle number has been counted.

Further, in some implementations, providing the pulse modulator 1310 further includes providing at least one signal delay circuit configured to delay the difference indicator signal by a delay to generate a delayed indicator signal and providing an OR logic coupled to the at least one signal delay circuit. The OR logic combines the difference indicator signal and the delayed indicator signal to merge a plurality of pulses of the first indicator signal and generate each pulse zero pulse of the first range indicator signal 1306.

In some implementations, providing the clock generator 334 further includes providing a voltage controlled oscillator (VCO) configured to be driven by a difference signal 714 and generate the periodic signal 336 based on the difference signal. The difference signal 714 has a temporal voltage level that corresponds to a frequency mismatch between the input signal 338 and a feedback clock 710 generated from the periodic signal 336, and the periodic signal 336 has an output frequency that varies with the temporal voltage level. Further, in some implementations.

In some implementations, providing the controller 312 further includes providing a comparator 1602 configured to generate a difference signal 1604 having a temporal voltage level that indicates a frequency mismatch between the first and second reference signals REF1 and REF2. Providing the controller 312 further includes providing a signal conditioning circuit 1606 configured to receive the difference signal 1604 and generate a second range indicator signal 1608 enabled during the temporal range TR, thereby indicating a temporal width of the temporal range TR that is linearly related to a duty cycle of the second range indicator signal 1608. Additionally, in some implementations, the signal conditioning circuit 1606 is configured to generate the second range indicator signal 1608 by amplifying a difference amplitude of the difference signal 1604 to generate an amplified difference signal 614 having a first amplitude voltage, selecting a DC reference voltage (e.g., in a dynamic range of the difference signal 1604), and comparing the amplified difference signal 614 with the DC reference voltage to generate the second range indicator signal 1608. The duty cycle of the second range indicator signal 1608 decreases linearly with an increase of a magnitude of the DC reference voltage. In an example, the duty cycle is symmetric with respect to the peak instant $T_P$. Further, in some implementations, the signal conditioning circuit 1606 is configured to generate the second range indicator signal 1608 further by shifting a median level of the difference signal 1604 to the DC reference voltage. The duty cycle and the temporal width of the temporal range TR is equal to 50% of a period of the difference signal 1604, and the period of the difference signal 1604 is equal to a spreading period $T_{SPD}$ of the second reference signal REF2.

Further, the controller 312 is configured to determine that the temporal range TR of the second range indicator signal 1608 corresponds to a total clock cycle number. The known temporal position corresponds to a half of the total clock cycle number. The controller 312 is configured to from a start of the temporal range TR, increment a clock cycle number by 1 at each cycle of a high frequency clock. The switching instant $T_S$ is selected in response to the clock cycle number reaching a peak indicating number associated with the known temporal position in the temporal range TR, e.g., corresponding to 90% of a half of the total clock cycle number being counted.

In some implementations, providing the clock generator 334 includes providing a phase lock loop (PLL) 700, which further includes providing a PLL frequency or phase comparator 702 configured to receive the input signal 338 and the feedback clock 710 and generate a PLL comparison signal 712, providing a loop filter 704 coupled to the PLL frequency or phase comparator 702 and configured to generate the difference signal 714 based on the PLL comparison signal 712, providing the voltage controlled oscillator (VCO) 706 coupled to the loop filter 704, and providing a feedback path 708 coupled to the VCO 706 and PLL frequency or phase comparator 702. The feedback path 708 is configured to convert the periodic signal 336 to the feedback clock 710 and feed the feedback block 708 to the PLL frequency or phase comparator 702. Further, in some implementations, providing the PLL 700 further includes providing a charge pump circuit 722 coupled to the loop filter 704. The charge pump 722 is configured to control a variation rate of the difference signal 714, such that in response to the input signal 338 being switched from the first reference signal REF1 to the second reference signal REF2, an overshoot on an output frequency of the periodic signal 336 is less than a predefined portion of the periodic frequency.

In some implementations, the controller 312 is configured to from a start of the temporal range TR, increment a clock cycle number by 1 at each cycle a high frequency clock. The switching instant $T_S$ is selected in response to the clock cycle number reaches a peak indicating number, the peak indicating number associated with the known temporal position in the temporal range TR. Further, in some implementations, the temporal range TR is a first temporal range TR1, and a second temporal range TR2 precedes the first temporal range TR1 and includes a second peak instant $T_P$ at which the second reference signal REF2 reaches the peak frequency. The controller 312 is further configured to, while the first reference signal REF1 has been selected as the input signal 338 before the second temporal range TR2, count a second clock cycle number from 1 according to the high frequency clock from a start of the second temporal range TR2, determine that the second temporal range TR2 corresponds to a total clock cycle number, and determine the peak indicating number based on the known temporal position.

In some implementations, a frequency of the second reference signal REF2 is rising towards the peak frequency during the temporal range TR, and the selector 332 is controlled by the controller 312 to select the second reference signal REF2 in place of the first reference signal REF1 when the frequency of the second reference signal REF2 is rising towards the peak frequency in the temporal range TR.

In some implementations, the controller 312 is further configured to receive a system reset signal and determine whether the system reset signal is enabled while the first reference signal REF1 is selected as the input signal 338. The selector 332 is controlled by the controller 312 to select the second reference signal REF2 in place of the first reference signal REF1 at the switching instant $T_S$ in accordance with a determination that the system reset signal is enabled.

In some implementations a data link having a retimer is further provided. The retimer includes a transmitter portion, a receiver portion, the selector 332, the clock generator 334, and the controller 312. The retimer is configured to operate at a training mode and a data transmission mode, reconfigure the receiver portion based on the periodic signal 336 that is generated from the first reference signal REF1 during the training mode, and communicate data in synchronization with the periodic signal 336 that is generated from the second reference signal REF2 during the data transmission mode.

In some implementations, the first reference signal REF1 has a first frequency that is substantially stable. The peak frequency is equal to the first frequency. The second reference signal REF2 has a second frequency that varies periodically between the peak frequency and a down-spreading frequency. The second frequency of the second reference signal REF2 varies with a spreading frequency corresponding to a spreading period $T_{SPD}$ In some situations, the controller 312 is configured to: monitor an overshoot of an output frequency of the periodic signal 336 and dynamically adjust the temporal range TR based on the overshoot of the output frequency of the periodic signal 336. In an example, the output frequency of the periodic signal 336 is substantially equal to 20 GHz. The first frequency of the first reference signal REF1 is substantially equal to 25 MHz. The spreading frequency is substantially equal to 30 kHz. The second frequency of the second reference signal REF2 varies, periodically with the spreading frequency, between 25 MHz and 24.875 MHz. The temporal range TR is less than 0.5% of the spreading period $T_{SPD}$.

In some implementations, the switching instant $T_S$, a rising edge of the first reference signal REF1, and a rising edge of the second reference signal REF2 are synchronized with each other.

It should be understood that the particular order in which the operations in each of FIGS. 20 and 21 have been described are merely exemplary and are not intended to indicate that the described order is the only order in which the operations could be performed. One of ordinary skill in the art would recognize various ways to providing an electronic device for frequency controlling as described herein. Additionally, it should be noted that details of other processes and structures described above with respect to FIGS. 1-19 are also applicable in an analogous manner to method 2000 or 2100 described above with respect to FIG. 20 or 21. For brevity, these details are not repeated here.

It will also be understood that, although the terms first, second, etc. are, in some instances, used herein to describe various elements, these elements should not be limited by these terms. These terms are only used to distinguish one element from another. For example, a first electronic device can be termed a second electronic device, and, similarly, a second electronic device can be termed a first electronic device, without departing from the scope of the various described implementations. The first electronic device and the second electronic device are both electronic device, but they are not the same electronic device.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The above description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. An electronic device, comprising:
   a selector configured to select one of a first reference signal and a second reference signal as an input signal having an input phase;
   a clock generator coupled to the selector, the clock generator being configured to receive the input signal and generate a periodic signal with reference to the input signal, the periodic signal having an output phase that matches the input phase of the input signal; and
   a controller coupled to the selector, the controller configured to, while the first reference signal is selected as the input signal:
      identify a temporal range including a peak instant at which the second reference signal reaches a peak frequency, the peak instant having a known temporal position with respect to the temporal range;
      select a switching instant within the temporal range based on the known temporal position; and
      at the switching instant, control the selector to select the second reference signal as the input signal.

2. The electronic device of claim 1, wherein the controller further comprises:
   a phase frequency detector configured to receive the first and second reference signals and generate a difference indicator signal indicating a phase difference between phases of the first and second reference signals; and
   a pulse modulator coupled to the phase frequency detector, the pulse modulator configured to modulate the difference indicator signal and generate a first range indicator signal enabled during a plurality of pulse zero durations, wherein the temporal range is identified in the plurality of pulse zero durations based on a width of each pulse zero duration.

3. The electronic device of claim 2, wherein the pulse modulator includes a low pass filter having a cutoff frequency, and the width of each pulse zero duration of the first range indicator signal increases with a decrease of the cutoff frequency.

4. The electronic device of claim 2, wherein the controller is configured to:
   identify one of the plurality of pulse zero durations of the first range indicator signal as the temporal range;
   from a start of the temporal range identified in the first range indicator signal, increment a clock cycle number by 1 at each cycle of a high frequency clock, wherein the switching instant is selected in response to the clock cycle number reaching a peak indicating number, the peak indicating number associated with the known temporal position with respect to the temporal range.

5. The electronic device of claim 2, wherein the pulse modulator further comprising:
   at least one signal delay circuit configured to delay the difference indicator signal by a delay to generate a delayed indicator signal;
   an OR logic coupled to the at least one signal delay circuit, the OR logic combining the difference indicator signal and the delayed indicator signal to merge a plurality of pulses of the difference indicator signal and generate each pulse zero pulse of the first range indicator signal.

6. The electronic device of claim 1, the controller further comprising:
   a comparator configured to generate a difference signal having a temporal voltage level that indicates a frequency mismatch between the first and second reference signals; and a signal conditioning circuit configured to receive the difference signal and generate a second range indicator signal enabled during the temporal range, thereby indicating that a temporal width of the temporal range linearly is related to a duty cycle of the second range indicator signal.

7. The electronic device of claim 6, wherein the signal conditioning circuit is configured to generate the second range indicator signal by:
amplifying a difference amplitude of the difference signal to generate an amplified difference signal having a first amplitude voltage;
selecting a DC reference voltage;
comparing the amplified difference signal with the DC reference voltage to generate the second range indicator signal, the duty cycle of the second range indicator signal decreasing linearly with an increase of a magnitude of the DC reference voltage.

8. The electronic device of claim 7, wherein the signal conditioning circuit is configured to generate the second range indicator signal further by:
shifting a median level of the difference signal to the DC reference voltage, wherein the duty cycle and the temporal width of the temporal range is equal to 50% of a period of the difference signal, and the period of the difference signal is equal to a spreading period of the second reference signal.

9. The electronic device of claim 6, wherein the controller is configured to:
determine that the temporal range of the second range indicator signal corresponds to a total clock cycle number, wherein the known temporal position corresponds to a half of the total clock cycle number;
from a start of the temporal range, increment a clock cycle number by 1 at each cycle of a high frequency clock, wherein the switching instant is selected in response to the clock cycle number reaching a peak indicating number, the peak indicating number associated with the known temporal position in the temporal range.

10. The electronic device of claim 1, wherein the clock generator further comprises:
a voltage controlled oscillator (VCO) configured to be driven by a difference signal and generate the periodic signal based on the difference signal, the difference signal having a temporal voltage level that corresponds to a frequency mismatch between the input signal and a feedback clock generated from the periodic signal, the periodic signal having an output frequency that varies with the temporal voltage level.

11. The electronic device of claim 1, wherein the clock generator further comprises a phase lock loop (PLL), the PPL further comprising:
a PLL frequency or phase comparator configured to receive the input signal and the feedback clock and generate a PLL comparison signal;
a loop filter coupled to the PLL frequency or phase comparator, the PLL configured to generate the difference signal based on the PLL comparison signal;
the voltage controlled oscillator (VCO) coupled to the loop filter; and
a feedback path coupled to the VCO and PLL frequency or phase comparator, the feedback path configured to convert the periodic signal to the feedback clock and feed the feedback block to the PLL frequency or phase comparator.

12. The electronic device of claim 11, wherein the PLL further comprises:
a charge pump circuit coupled to the loop filter, the charge pump configured to control a variation rate of the difference signal, such that in response to the input signal being switched from the first reference signal to the second reference signal, an overshoot on an output frequency of the periodic signal is less than a predefined portion of the periodic frequency.

13. The electronic device of claim 1, wherein the controller is configured to:
from a start of the temporal range, increment a clock cycle number by 1 at each cycle a high frequency clock, wherein the switching instant is selected in response to the clock cycle number reaches a peak indicating number, the peak indicating number associated with the known temporal position in the temporal range.

14. The electronic device of claim 13, wherein the temporal range is a first temporal range, and the controller is further configured to:
while the first reference signal has been selected as the input signal before a second temporal range, wherein the second temporal range precedes the first temporal range and includes a second peak instant at which the second reference signal reaches the peak frequency:
from a start of the second temporal range, count a second clock cycle number from 1 according to the high frequency clock;
determine that the second temporal range corresponds to a total clock cycle number; and
based on the known temporal position, determine the peak indicating number.

15. The electronic device of claim 1, wherein a frequency of the second reference signal is rising towards the peak frequency during the temporal range, and the selector is controlled by the controller to select the second reference signal in place of the first reference signal when the frequency of the second reference signal is rising towards the peak frequency in the temporal range.

16. The electronic device of claim 1, wherein the controller is further configured to;
receive a system reset signal;
while the first reference signal is selected as the input signal, determine whether the system reset signal is enabled, wherein the selector is controlled by the controller to select the second reference signal in place of the first reference signal at the switching instant in accordance with a determination that the system reset signal is enabled.

17. The electronic device of claim 1, further comprising a data link having a retimer, wherein the retimer includes a transmitter portion, a receiver portion, the selector, the clock generator, and the controller, and is configured to:
operate at a training mode and a data transmission mode;
reconfigure the receiver portion based on the periodic signal that is generated from the first reference signal during the training mode; and
communicate data in synchronization with the periodic signal that is generated from the second reference signal during the data transmission mode.

18. The electronic device of claim 1, wherein:
the first reference signal has a first frequency that is substantially stable;
the peak frequency is equal to the first frequency;
the second reference signal has a second frequency that varies periodically between the peak frequency and a down-spreading frequency; and the second frequency of the second reference signal varies with a spreading frequency corresponding to a spreading period.

19. The electronic device of claim 18, wherein:

the output frequency of the periodic signal is substantially equal to 20 GHz;

the first frequency of the first reference signal is substantially equal to 25 MHz;

the spreading frequency is substantially equal to 30 kHz;

the second frequency of the second reference signal varies, periodically with the spreading frequency, between 25 MHz and 24.875 MHz; and the temporal range is less than 0.5% of the spreading period.

20. The electronic device of claim 1, wherein the switching instant, a rising edge of the first reference signal, and a rising edge of the second reference signal are synchronized with each other.

* * * * *